(12) United States Patent
Tanitsu et al.

(10) Patent No.: US 6,238,063 B1
(45) Date of Patent: May 29, 2001

(54) ILLUMINATION OPTICAL APPARATUS AND PROJECTION EXPOSURE APPARATUS

(75) Inventors: Osamu Tanitsu, Funabashi; Masato Shibuya, Ohmiya; Nobumichi Kanayamaya, Kawasaki, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/300,660

(22) Filed: Apr. 27, 1999

(30) Foreign Application Priority Data

| Apr. 27, 1998 | (JP) | 10-117434 |
| Jan. 29, 1999 | (JP) | 11-021591 |
| Feb. 3, 1999 | (JP) | 11-025629 |

(51) Int. Cl.$^7$ .................................................. F21V 13/10
(52) U.S. Cl. ........................... 362/268; 362/19; 362/259; 362/301; 362/346; 359/629
(58) Field of Search ..................................... 362/551, 259, 362/268, 293, 19, 298, 301, 346; 359/618–622, 629

(56) References Cited

U.S. PATENT DOCUMENTS

| 5,016,149 | * | 5/1991 | Tanaka et al. | 362/259 |
| 5,153,773 | | 10/1992 | Muraki et al. | 359/619 |
| 5,363,170 | | 11/1994 | Muraki | 355/67 |
| 5,459,547 | * | 10/1995 | Shiozawa | 362/268 |

FOREIGN PATENT DOCUMENTS 1198759    8/1989   (JP) .

* cited by examiner

*Primary Examiner*—Alan Cariaso
(74) *Attorney, Agent, or Firm*—Oliff & Berridge PLC

(57) ABSTRACT

An illumination optical apparatus (IOA1) and an exposure apparatus (EA1) having same, that reduces coherence in the illumination light beam, which in turn eliminates illumination non-uniformities at the mask (13) and wafer (17). The illumination apparatus comprises, in order along an optical axis (AX), a coherent light source (1) capable of generating a first light beam (b1) having a coherence length, the light beam being directed along a first optical path. Further included is a depolarizer (3) and a first optical delay element (4). The latter is capable of splitting from the first light beam a second light beam (b4) which travels a delay optical path (DOP1) with a path length not less than the coherence length of the first light beam. The delay optical path returns to said first optical path at a deflection angle from said optical delay element. The illumination optical system may also include a plurality (i.e., second, third, etc.) optical delay elements or splitting delay stages (e.g., 213–215) having different path lengths.

23 Claims, 20 Drawing Sheets

ILLUMINATION OPTICAL APPARATUS AND PROJECTION EXPOSURE APPARATUS

FIELD OF THE INVENTION

The present invention pertains to an exposure apparatus for fabrication of semiconductor devices, and in particular pertains to an illumination optical apparatus that can be used in an exposure apparatus.

BACKGROUND OF THE INVENTION

Conventional prior art illumination optical apparatus include, for example, that disclosed in Japanese Laid-Open Patent Application (Kokai) No. H1[1989]-198759, shown in FIG. 21. With reference to FIG. 22, a light beam b1 from a laser light source 400 is incident a first triangular prism 401 serving as an optical delay element. Prism 401 has an incident surface 401S. A portion of light beam b1 incident triangular prism 401 at surface 401S is reflected therefrom at a location L1 without entering the interior thereof. The remaining portion of the light beam enters the interior of prism 401 travels a triangularly shaped delay optical path DOP1, and thereafter returns to location L1.

The portion of light beam b1 that returns to point L1 exits therefrom along the same optical path as the portion of light beam b1 reflected from surface 401S. The remaining portion of the beam within prism 401 once again passes through delay optical path DOP1, and returns to location L1.

In this way, light beam b1 from laser light source 400 is temporally split into a plurality of light beams (theoretically, an infinite number of light beams) at optical delay element 401. Any two temporally consecutive light beams will have an optical path length difference equal to the optical path length of delay optical path DOP1. Furthermore, the optical path length of delay optical path DOP1 is set to be not less than the temporal coherence length of light beam b1 from laser light source 400.

In this manner, a light beam b2 is formed from light beam b1 Light beam b2 is incident a second triangular prism 402 serving as a second optical delay element. Triangular prism 402 has a constitution similar to that of triangular prism 401, the only fundamental difference being that the optical path length of the triangularly shaped delay optical path DOP2 thereof is set to be twice DOP1. Accordingly, a light beam passing through first optical delay element 401 is thereafter temporally split into a plurality of light beams at second optical delay element 402. Any two temporally consecutive light beams exiting from second optical delay element 402 are imparted with an optical path length difference that is twice the optical path length difference of first optical delay element 401.

In this manner, a light beam b3 is formed from light beam b2. The former is incident a fly-eye lens 403, which forms a secondary light source image SL1 comprising a multiplicity of light source images at the rear focus thereof. A light beam b4 from secondary light source image SL1 passes through a condenser lens 404 and illuminates, in superimposed fashion, a mask 405 set at a plane of illumination P1.

As described above, the conventional illumination optical apparatus shown in FIG. 22 permits reduction of coherence even when a coherent light source is employed. This is achieved by creating a series of light beams successively generated using a first optical delay element 401 and a second optical delay element 402 with optical path length differences not less than the coherence length.

Considering the peak width at half height of laser light source 400 to be D1 and wavelength to be λ, the temporal coherence length tc is in general given by:

$$tc=\lambda^2/D1.$$

If λ=248 nm and D1=0.8 pm, then tc=77 mm; if λ=248 nm and D1=0.6 pm, then tc=103 mm.

In principle, the light within an optical delay element could make an infinite number of passes over the delay optical path before exiting the optical delay element, based on half mirror reflectance, reflecting member reflectance, and so forth. However, half mirror reflectance is typically set at on the order of between 33% and 50%. Setting the reflectance at such a value allows the light to exit the optical delay element after between roughly two or three passes, assuming down to on the order of 1% of the light energy is to be used.

As described above, the value employed for coherence length has conventionally been a function of the entire spectral distribution of the light source. However, upon using an excimer laser and attempting to obtain uniform illumination therefrom, it has been found that the expected uniform illumination cannot be obtained despite the use of coherence reduction means such as described above.

Furthermore, with a conventional illumination optical apparatus such as described above, the delay optical path of the optical delay element is triangular in shape. Thus, the light beam incident the optical delay element can become offset in parallel fashion from the reference optical axis due to the influence of, for example, vibration of the apparatus or the like. In this case, the light beam entering the interior of the optical delay element will no longer return to the location at which it was originally incident. As a result, the optical path of the light beam reflected from the surface of the optical delay element and will no longer be coincident with the optical path of the light beam that enters the interior of the optical delay element, makes just one pass through the delay optical path thereof, and exits therefrom. Consequently, the optical paths of the series of light beams successively generated by way of the two optical delay elements will no longer mutually coincide. Instead, they will move progressively farther away from the reference optical axis. Thus, with the conventional illumination optical apparatus as described above, instabilities arise with respect to vibration. Further, it is difficult to carry out optical adjustments on the apparatus.

SUMMARY OF THE INVENTION

The present invention pertains to an exposure apparatus for fabrication of semiconductor devices, and in particular pertains to an illumination optical apparatus that can be used in an exposure apparatus.

A goal of the present invention is to provide an illumination optical apparatus that adequately permits adequate reduction of coherence even when an excimer laser light source is used, and an exposure apparatus employing such an illumination optical apparatus. A further goal of the present invention is to provide an illumination optical apparatus that is highly stable with respect to vibration and that permits easy optical adjustment, and an exposure apparatus equipped with such an illumination optical apparatus.

Accordingly, a first aspect of the invention is an illumination optical apparatus comprising a coherent light source capable of providing a first light beam with a coherence length along a first optical path. The apparatus further includes a first optical delay element capable of splitting from the first light beam a second light beam having a first delay optical path. The first path length is not less than the coherence length of the first light beam. Also, the first delay optical path returns to the first optical path at a first deflection angle.

A second aspect of the invention is the illumination optical apparatus as described above, further including (m−1) additional optical delay elements, for a total of m optical delay elements, wherein m is an integer equal to 2 or greater. The apparatus further includes a depolarizer arranged between the light source and a most light-source-wise optical delay element. The depolarizer has an S-polarized delay length L associated with S-polarized light. Also, the first optical delay element has a delay optical path of 2n×L, where n is an integer, the second optical delay element has a delay optical path of 6n×L, and the mth optical delay element has a delay optical path of $2 \times m^2 \times L$.

A third aspect of the invention is an exposure apparatus for exposing a pattern present a mask onto a substrate. The apparatus comprises the illumination optical apparatus as described above, and a projection objective lens arranged adjacent the illumination optical apparatus and having an image plane and an object plane. A mask holder is arranged between the illumination optical system and the projection objective lens and is capable of holding the mask in the object plane. The exposure apparatus further includes a substrate holder adjacent the projection objective lens opposite the mask holder, and is capable of holding a substrate in the image plane.

DETAILED DESCRIPTION OF THE INVENTION

The present invention pertains to an exposure apparatus for fabrication of semiconductor devices, and in particular pertains to an illumination optical apparatus that can be used in an exposure apparatus.

Figure 9A:
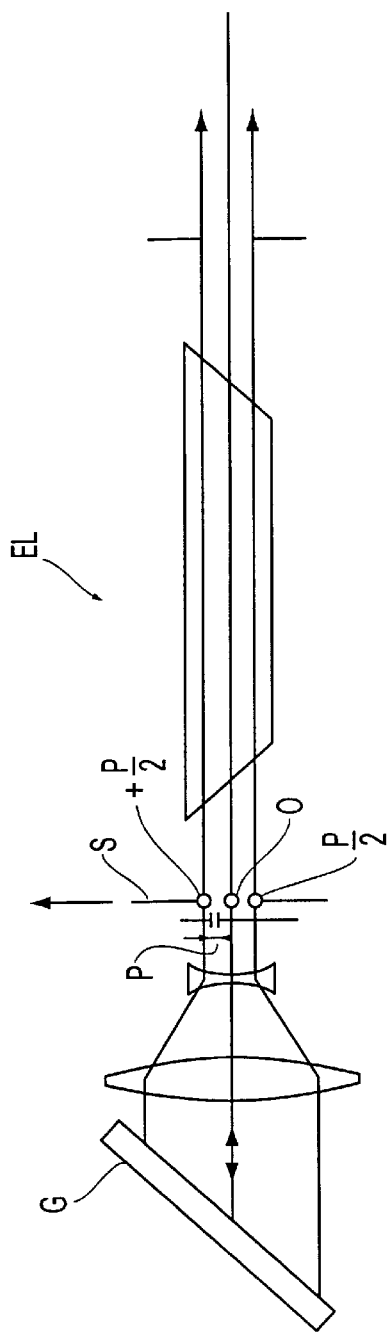
FIG. 9a is a schematic diagram of an excimer laser showing the elements, including a grating, for narrowing the bandwidth of the spectral distribution of the light generated by the laser.
Figure 9B:
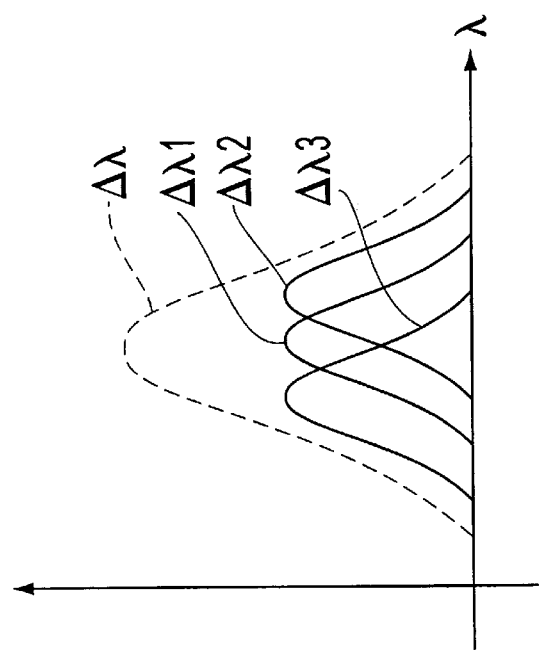
FIG. 9b is a plot of the emission spectral distribution of an excimer laser at three different positions along the exit slit, and the overall (combined) emission spectral distribution.

The present invention employs a coherent light source, such as an excimer laser EL. Thus, with reference first to FIGS. 9a and 9b, excimer laser EL includes a diffraction grating G to narrow the peak bandwidth at half height of the spectral distribution thereof. In this way, when a laser EL has a grating G at the interior thereof, wavelength distributions $\Delta\lambda_1$, $\Delta\lambda_2$ and $\Delta\lambda_3$ will be generated, as shown in FIG. 9b, at spectral line regions on an exit slit S (e.g., at locations +p/2, 0, and −p/2 in FIG. 9a. That is, a collection of a multiplicity of microscopic light source spectral distributions formed at spectral line regions on the exit slit will be collected thereat, forming the spectral distribution $\Delta\lambda$ of the macroscopic light source.

In this way, a light source may be considered to be formed from a collection of a multiplicity of light source microelements. The spatial resolution p of separate observable neighboring microscopic light sources (which can be estimated from the divergence angle ω of the excimer laser as p~λ/ω) may be finer (smaller) than the slit width P. In this case, it will be necessary to understand coherence length in terms of a microscopic coherence length tcp. The tcp is calculated from the wavelength distribution Δλ1 falling within this spatial resolution, as follows:

$$tcp=\lambda^2/\Delta\lambda p$$

(here, macroscopic coherence length tc<microscopic coherence length tcp). If a multiplicity of these slit images are generated by means of delay element(s) and the delay optical path length is based on simply the coherence length tc as determined from the macroscopic wavelength distribution, light from respective slit images separated by an arbitrarily sized spatial resolution will mutually interfere. This interference will then produce unwanted interference fringes and spectral lines at the plane of illumination.

For example, consider the case of a KrF excimer laser having a central wavelength of λ=248 nm, with a peak width at half height Δλ of 0.8 pm as determined from the wavelength distribution of the macroscopic light source. The macroscopic temporal coherence length tc will be on the order of 77 mm, with a peak width at half height Δ1 on the order of 0.4 pm as determined from the wavelength distribution within the spatial resolution the microscopic temporal coherence length tcp will be on the order of 154 mm. Again, whereas with a peak width at half height Δλ of 0.6 pm as determined from the wavelength distribution of the macroscopic light source the macroscopic temporal coherence length tc will be on the order of 103 mm, with a peak width at half height Δλ on the order of 0.3 pm as determined from the wavelength distribution within the spatial resolution. The microscopic temporal coherence length tcp will be on the order of 206 mm.

As discussed in further detail below, the present invention makes it possible to eliminate nonuniformity in illumination by making the delay optical path length of an optical delay element longer than a microscopic temporal coherence length tcp which is determined based on the wavelength distribution of light within the spatial resolution of a coherent light source. This may also be accomplished by making the delay optical path length longer than the microscopic temporal coherence length tcp. The latter is determined based on the wavelength distribution of light within the spatial resolution at a location in the vicinity of a light source conjugate to a reticle in the plane of illumination.

The above description is based on a wavelength distribution generated at spectral line regions on an exit slit. However, it is sufficient only that the exiting light beam have characteristics such as will generate a wavelength distribution. Furthermore, an excimer laser is employed as an example in the above description. However, the present invention may be effectively employed to reduce coherence with any coherent light source having characteristics such that a collection of a multiplicity of microscopic coherent light source microelements is formed thereat.

As discussed in further detail below, the present invention is equipped with splitting delay means comprising a beam splitter and a delay optical path that guides back to the beam splitter a second light beam (the light beam first reflected by the beam splitter and the light beam transmitted thereby during the second and successive passes). The second light beam exits the beam splitter in a direction different from a reference optical axis. This splitting delay means permits a light beam incident thereon along a reference optical axis to be temporally split into a plurality of light beams. Any two temporally consecutive light beams are imparted with an optical path length difference equal to the optical path length of the delay optical path. Here, the optical path length difference is set such that it is not less than the temporal coherence length of a light beam from the light source. Accordingly, coherence in the wavetrains produced by the splitting delay means can be reduced. This, in turn, allows the occurrence of interference fringes and spectral lines at the plane of illumination to be satisfactorily controlled.

The delay optical path of the present invention is formed so as to direct the second light beam from the beam splitter toward the beam splitter after it has been deflected an even number of times. In addition, this delay optical path is also formed so as to return the second light beam to the location at which it was originally incident, even in the event that this location is offset from the aforesaid reference optical axis. This will be the case when the light beam is incident such that it is offset in more or less parallel fashion from the reference optical axis. Accordingly, even if the light beam incident the beam splitter from the light source should become offset in more or less parallel fashion from the reference optical axis due to the influence of, for example, vibration of the apparatus or the like, the optical paths of the series of light beams generated by way of the splitting delay means will not become offset with respect to one another. This is true even though they will no longer be coincident with the reference optical axis.

Accordingly, an exposure apparatus incorporating the illumination optical apparatus of the present invention will be capable of carrying out satisfactory projection and exposure, having little nonuniformity in illumination due to interference and having satisfactory illumination conditions not easily disturbed by vibration.

Furthermore, because an exposure method wherein the illumination optical apparatus of the present invention is employed to expose a pattern of a mask onto a photosensitive substrate arranged in the plane of illumination makes it possible to carry out projection and exposure under conditions of satisfactory illumination, it is possible to fabricate satisfactory semiconductor devices.

EMBODIMENT 1

Below, a first embodiment illustrating the basic arrangement of the illumination optical apparatus of the present invention is described with reference to FIG. 1. Illumination optical apparatus IOA1 comprises along an optical axis AX, an excimer laser 1 for generating a first coherent light beam b1 a depolarizer 3, a first optical delay element 4, a second optical delay element 5, and a fly-eye optical integrator 7. Moreover, a number of mirrors M1–M3 are arranged along optical axis AX between these elements so as to bend the optical path for effective utilization of the space within the chamber (not shown) of illumination optical apparatus IOA1.

Figure 2A:
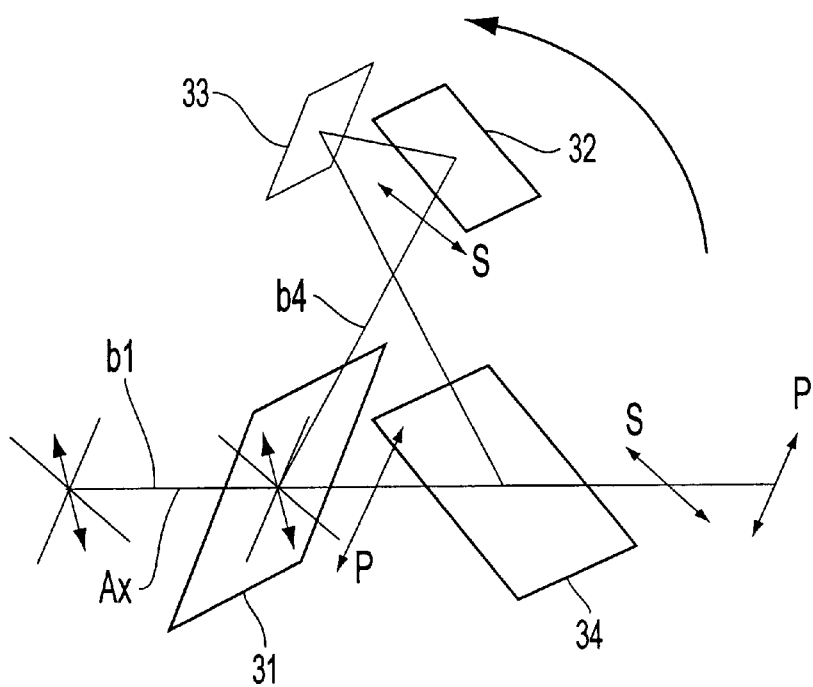
FIGS. 2a–2b are schematic optical diagrams of the depolarizer of the illumination optical apparatus of FIG. 1.
Figure 2B:
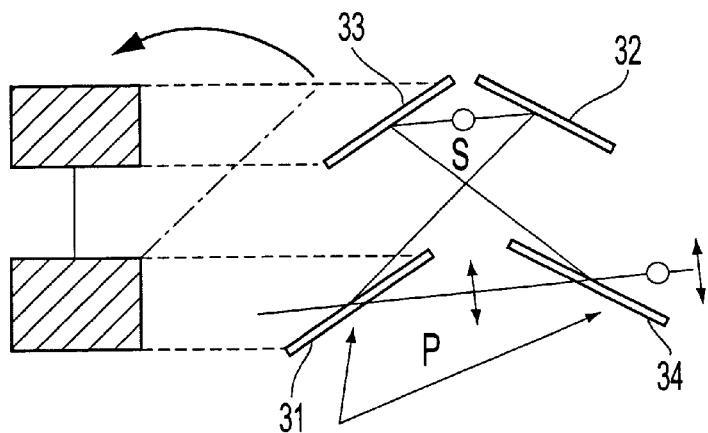
Figure 2C:
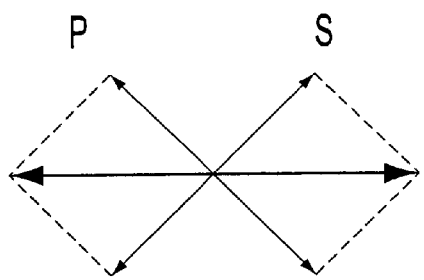
FIG. 2c illustrates the S-polarization and P-polarization directions associated with the depolarizer of FIGS. 2a and 2b.

With reference also to FIGS. 2a–2c, depolarizer 3 comprises polarizing beam splitters 31, 34 and reflecting mirrors 32, 33. Polarizing beam splitter 31 splits the light ray incident thereon into a P-polarized ray and an S-polarized ray which exit therefrom. The P-polarized ray then proceeds to polarizing, while the S-polarized ray proceeds to beam splitter 34, reflecting mirror 32, reflecting mirror 33, and polarizing beam splitter 34. Here, polarizing beam splitters 31 and 34 each comprising a quartz substrate or the like having a thin film coating. These beam splitters are arranged at an inclination such that the angle of incidence of the light ray incident thereon ranges from approximately the Brewster angle of 56.5° to approximately 65° depending on the design of the thin film. This is primarily to reflect the S-polarized ray and transmit the P-polarized ray. In addition, reflecting mirror 33 displaces the optical path of the reflected S-polarized ray such that the optical path length thereof differs from the optical path length for the P-polarized ray by an amount not less than the microscopic coherence length tcp=154 mm as determined from the wavelength distribution within the spatial resolution of the aforementioned slit. Beam splitter 34 then rejoins both the S-polarized ray and the P-polarized ray into a single (i.e. common) optical path.

Depolarizer 3 acts to eliminate the amplitude interference effect occurring between the S-polarized ray and the P-polarized ray. In addition, depolarizer 3 acts to eliminate amplitude interference occurring between circularly polarized rays, and between elliptically polarized rays, which are respectively derived from the P-polarized ray and the S-polarized ray. As a result, depolarization of the light at the wafer (as discussed below), is also achieved.

Adjustment of depolarizer 3 is generally performed by using an autocollimator for angular alignment, provided that separate adjustment of the depolarizer is possible. For this reason, a reflective film that reflects excimer laser light is vapor-deposited on the front side surface of a reflecting mirror. Also, a reflective film that reflects visible light is vapor-deposited on the back side surface thereof. By using a reflecting mirror vapor-deposited with such reflecting films, it is possible to eliminate the conventional adjustment process wherein the depolarizer section is removed, adjustment is carried out, and the depolarizer section is once returned to the optical path. Adjustment of depolarizer 3 in the present embodiment can thus be carried out using an autocollimator with the depolarizer still arranged within the optical path. Adjustment of the degree of polarization is carried out by rotating depolarizer 3 about optical axis AX.

Figure 3A:
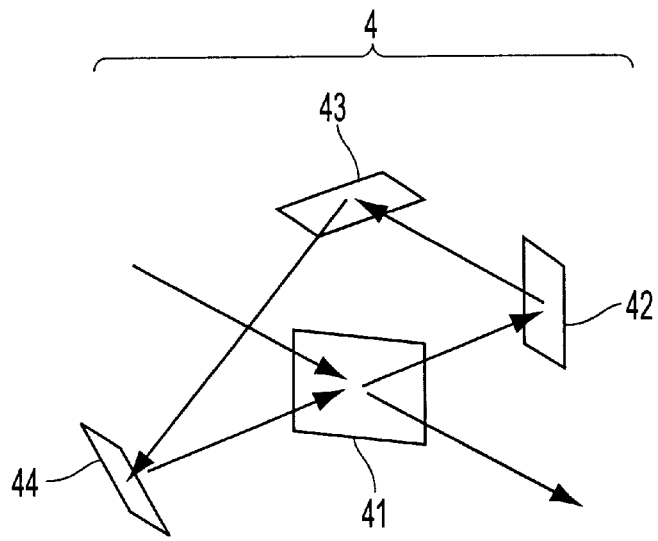
FIGS. 3a and 3b are schematic optical diagrams of the first and second optical delay elements of the illumination optical apparatus of FIG. 1.

With reference now to FIG. 3a, first optical delay element 4 consists of a half mirror 41 and three reflecting mirrors 42, 43, 44. These mirrors are arranged to produce a difference in optical path length of 2d between a light beam reflected from half mirror 41 and the light transmitted therethrough. By so doing, polarized light can be eliminated from the wavetrains produced by splitting, allowing reduction of coherence. Furthermore, in the present embodiment, we take the light ray (i.e., light beam b4) first transmitted through half mirror 41 to be the principal ray. Here, the reflectance of half mirror 41 averages on the order of between 33% and 50%. As illustrated in FIG. 3a, half mirror 41 and mirrors 42, 43 and 44 are arranged in a plane that crosses the incident light, and a delay optical path is formed by the reflected light.

Figure 3B:
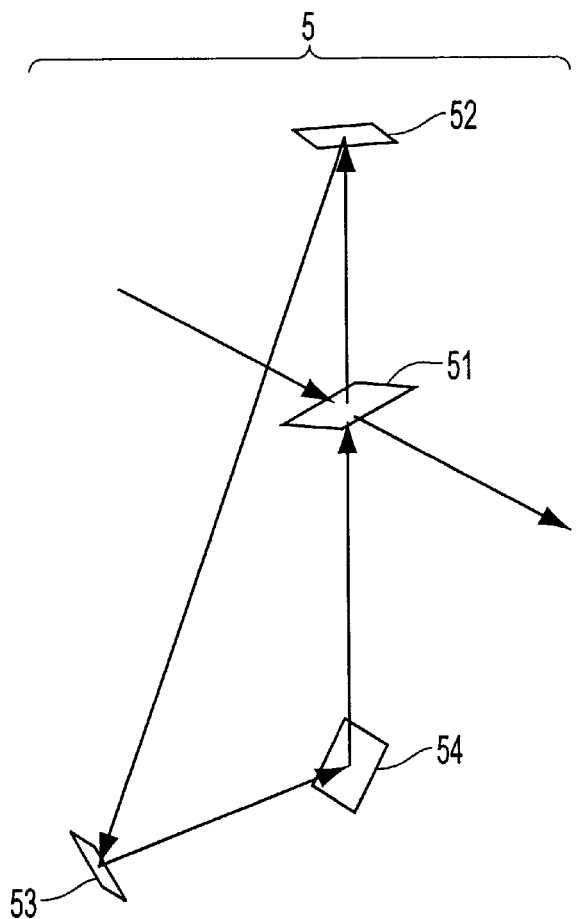
Figure 21:
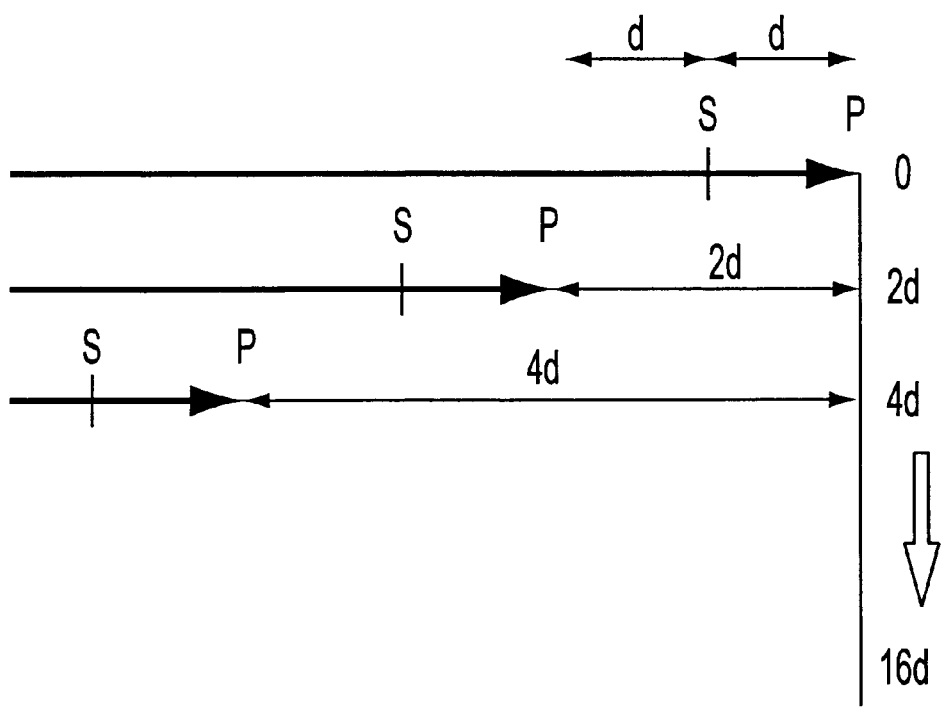
FIG. 21 is a diagram showing the delay optical path length differences.
Figure 22:
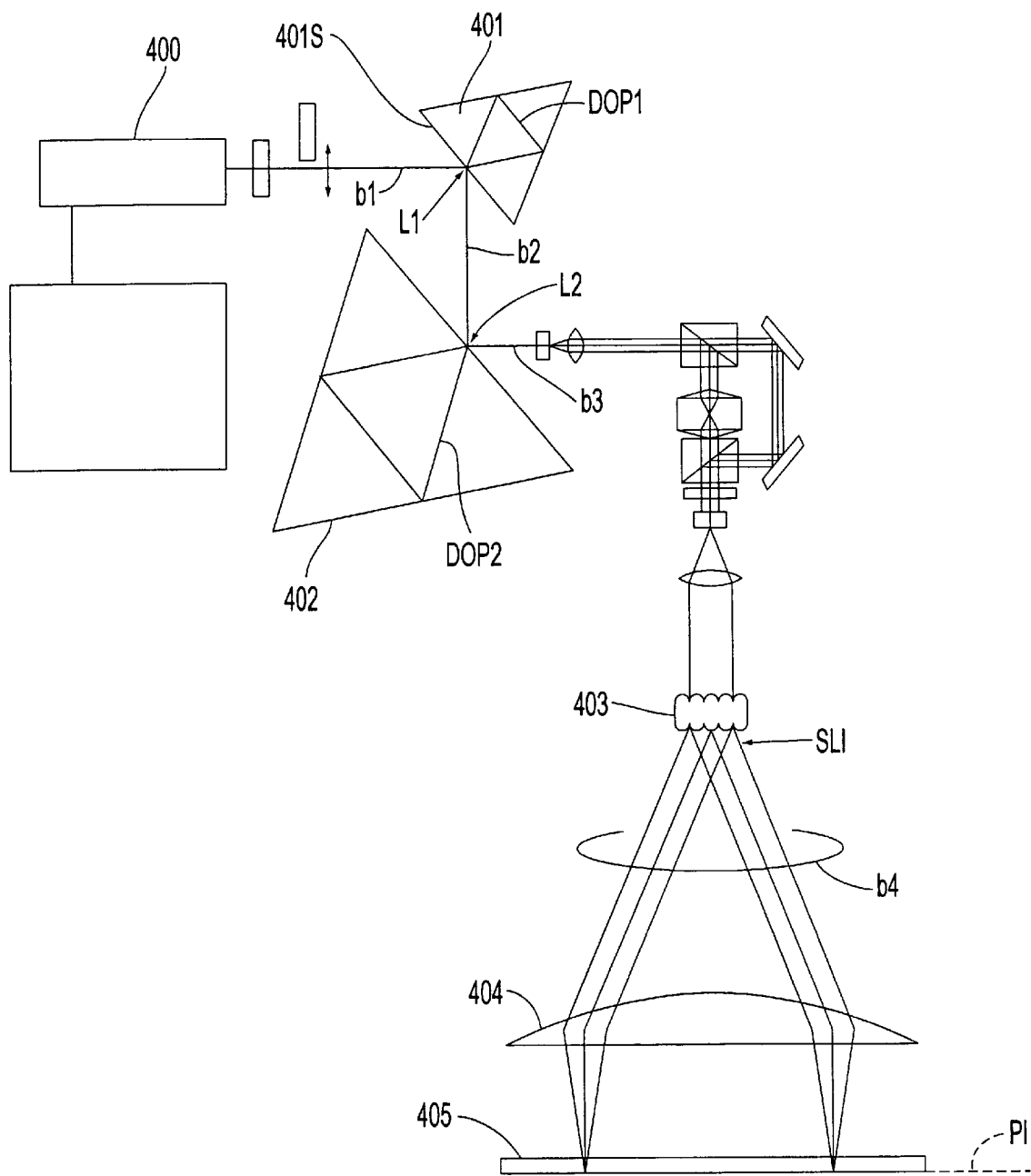
FIG. 22 is a schematic optical diagram of a prior art conventional illumination optical apparatus.

With reference now also to in FIG. 3b, a second optical delay element 5 consists of a half mirror 51 and three reflecting mirrors 52, 53, 54. These mirrors are arranged to produce a difference in optical path length of 6d. Furthermore, as with first optical delay element 4, the light ray first transmitted through half mirror 51 is considered the principal ray. As a result of so setting the delay optical path length of the first optical delay element 4 and the delay optical path length of the second optical delay element 5, there will be nine split light rays for which optical path length is nonidentical, illustrated in FIG. 21 and as shown at TABLE 1, below. As illustrated in FIG. 3b, half mirror 51 and mirrors 52, 53 and 54 are arranged in a plane that crosses the incident light, and a delay optical path is formed by the reflected light.

It is possible to utilize light beams temporally split nine times, more or less, if all of the light energy down to 2% is utilized. This allows reduction in coherence to be achieved. It is possible to utilize light beams temporally split eighteen times if all of the light energy down to 0.1% is utilized.

TABLE 1

| Optical delay path length differences | | | |
| --- | --- | --- | --- |
|  | 0 | 6d | 12d |
| 0 | 0 | 6d | 12d |
| 2d | 2d | 8d | 14d |
| 4d | 4d | 10d | 16d |

Figure 4A:
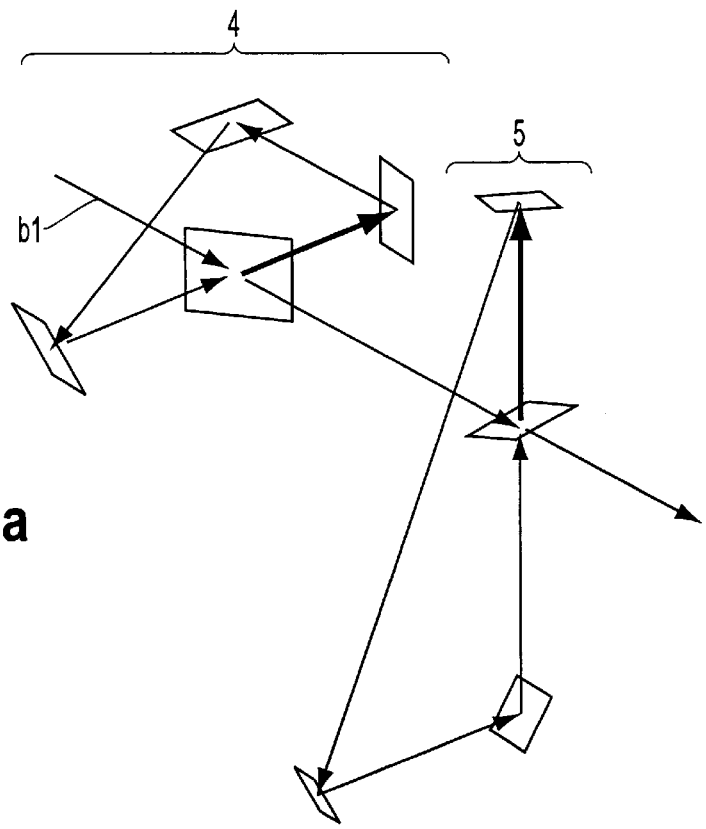
FIGS. 4a and 4b are schematic optical diagrams showing the delay action of the optical delay elements of the illumination optical apparatus of FIG. 1.
Figure 4B:
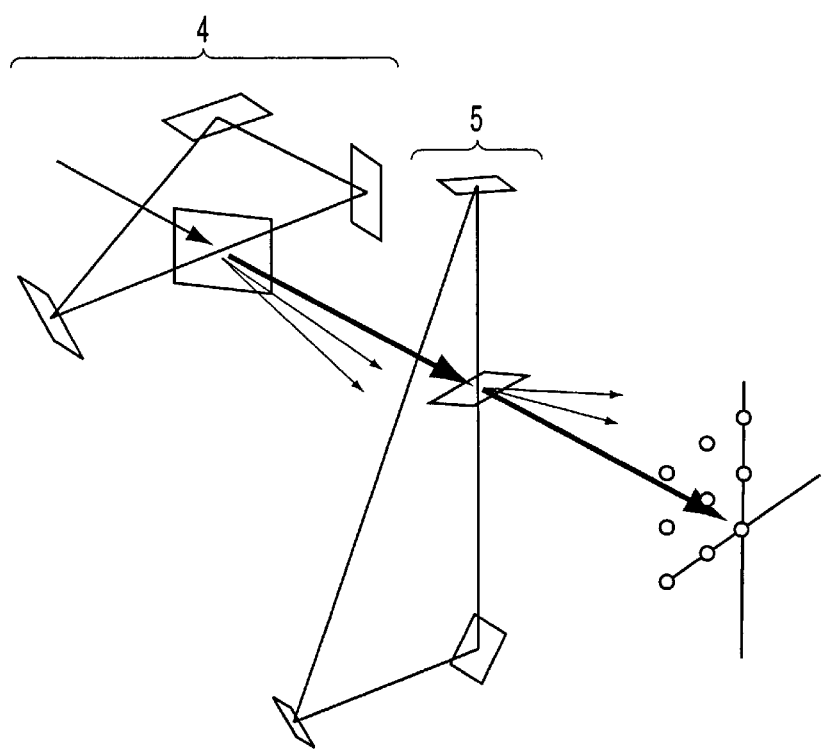

As shown in FIG. 3a, FIG. 3b and FIG. 4a, a first optical delay element 4 is arranged in a first plane, and includes half mirror 41 and mirrors 42, 43 and 44, and a second optical delay element 5 is arranged in a second plane parallel to the first plane, and includes half mirror 51 and mirrors 52, 53 and 54. The arrangement of the first optical delay element 4 is generally identical to the arrangement of the second optical delay element 5, except that the half mirror 41 of the first optical delay element 4 reflects part of the incident light in a horizontal direction, while the half mirror 51 of the second optical delay element 5 reflects part of the incident light in a vertical direction. As shown in FIG. 4b, every time light goes through the first optical delay element 4, a plurality of light beams shifted by angle q (first deflection angle) are emitted in a horizontal direction. On the other hand, every time light goes through the second optical delay element 5, a plurality of light beams shifted by a predetermined angle (second deflection angle) are emitted in a vertical direction. This results in the light beam incident fly-eye optical integrator 7 (see FIG. 1) being split into a plurality of light beams in which nine light beams have the energy more than 1%. As a result, not only is energy reduced, but speckle at the wafer is shifted.

Figure 5:
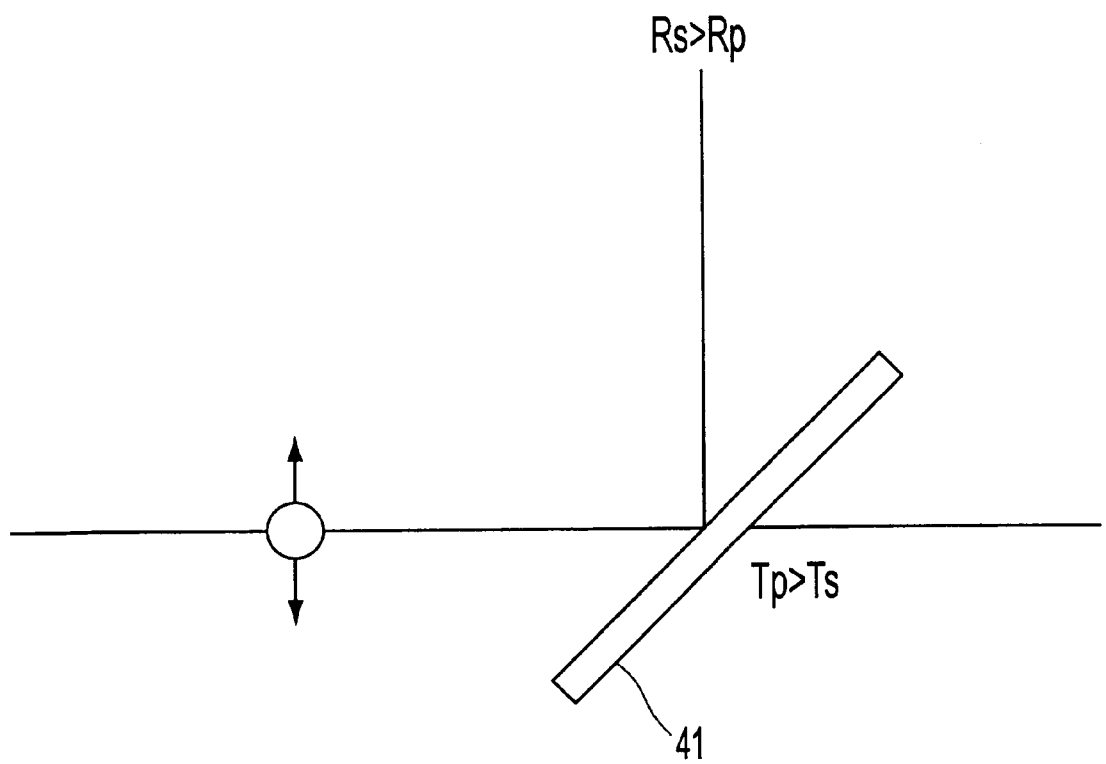
FIG. 5 is a close up view of the half mirror of the illumination optical apparatus of FIG. 1.
Figure 6:
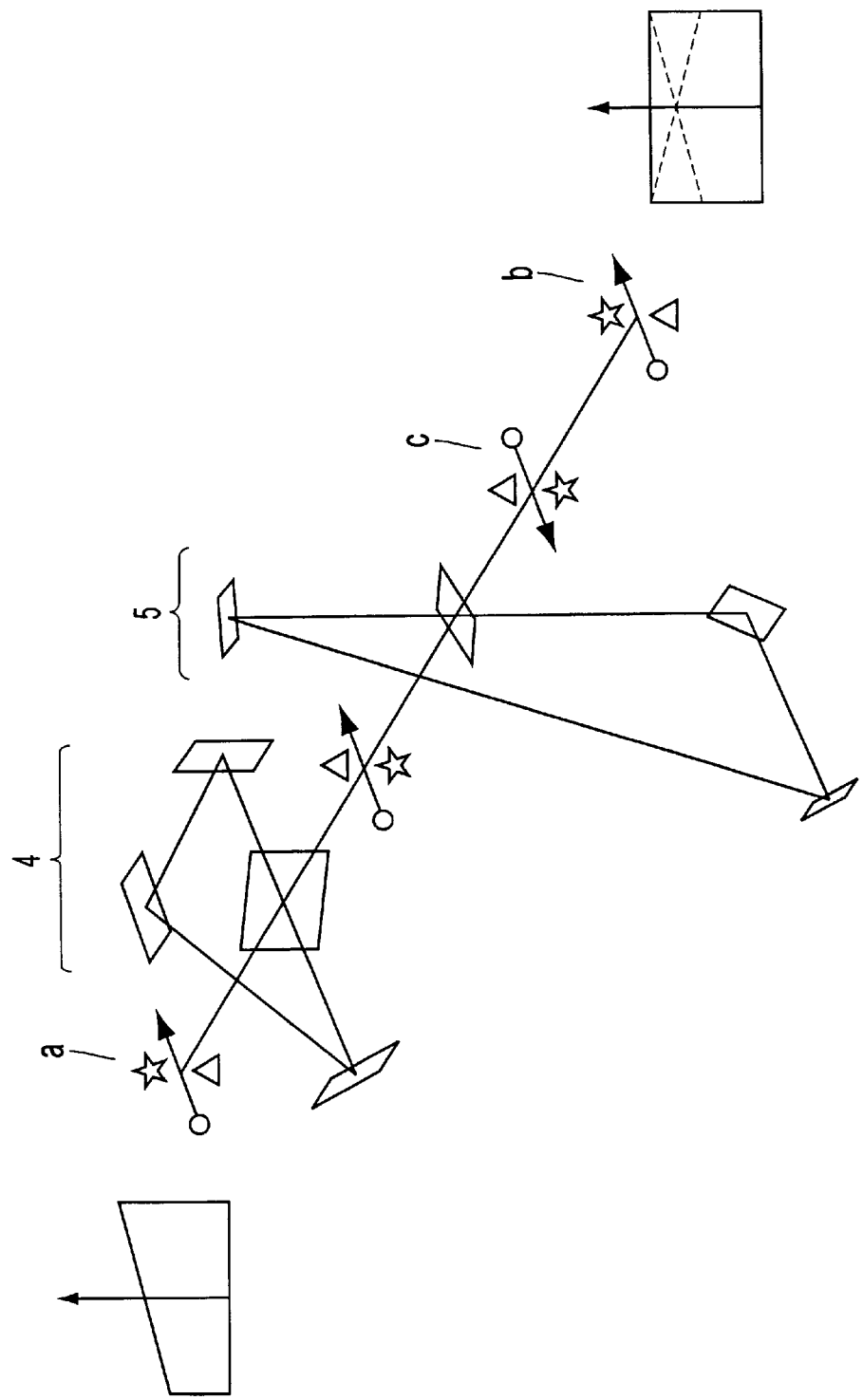
FIG. 6 is a schematic optical diagram showing the action of the optical delay elements of the illumination optical apparatus of FIG. 1.

With reference now to FIGS. 5 and 6, the reflectance of half mirror 41 or 51 is different, depending on whether the ray is P-polarized ray or S-polarized. Thus, making the half-mirror orientations mutually perpendicular causes the combined reflectance of the first and the second to be more or less the same for the S-polarized ray and the P-polarized ray, as shown in FIG. 5. This has the effect of causing there to be little change in the polarization state of the light beam incident fly-eye optical integrator 7 (see FIG. 1). Because the light profile is inverted in going from direct light b to reflected light c and d, as shown in FIG. 6, there is also the benefit that the profile of the laser light is averaged out.

Vapor-deposited on the front sides of reflecting mirrors 42–44 of first optical delay element 4 and mirrors 52–54 of second optical delay element 5 is a thin film (not shown) that primarily reflects the wavelength of excimer laser light. Vapor-deposited on the back sides thereof is a reflective film that primarily reflects visible light such as, for example, green light. This allows adjustment of the deflection angle through the use of an autocollimator. Conventionally, the use of a special setup mirror or the like for the purpose of adjustment is required. However, this increases the risk of misalignment during the exchange of mirrors and of disturbing the deflection angle. The need for exchange of mirrors is eliminated in the present invention through the use of a mirror that reflects both excimer laser light and visible light.

Figure 7A:
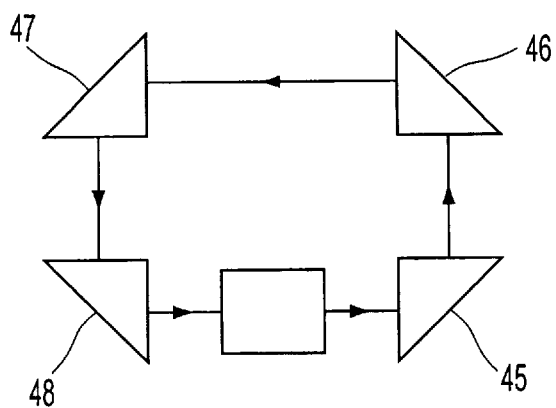
FIGS. 7a and 7b are schematic optical diagrams of an alternate embodiment of an optical delay element which employs prisms 7a and prisms and relay lenses 7b.
Figure 7B:
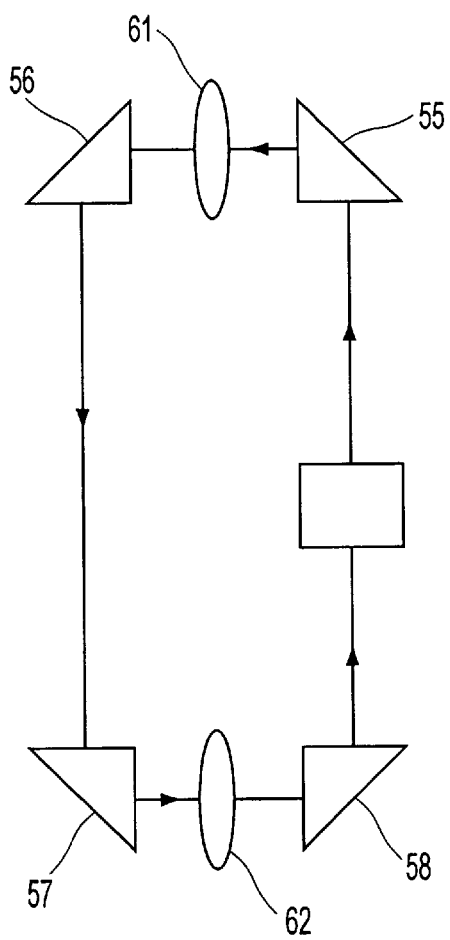

While a reflecting mirror could be used with a KrF excimer laser, such mirror might be unsuitable for use with an ArF laser, or with light sources having wavelengths the same as or shorter than an ArF laser. This is because the reflectance of such mirror is not very high. In this case, with reference to FIGS. 7a and 7b, instead of a mirror, one need only employ 45° prisms 45, 46, 47, 48, 55, 56, 57, and 58, which are made of fluorite or the like, to bend the optical path by total internal reflection. Here, by arranging relay lenses 61 and 62 within the optical delay element, (FIG. 7b), it is possible to construct an optical system wherein performance is not greatly affected despite occurrence of angular misalignment. Alternatively, instead of arranging a relay lens, a flat mirror may be replaced by a concave mirror. A concave mirror maintains the conjugate relationship maintained by the relay lens.

EMBODIMENT 2

Figure 8:
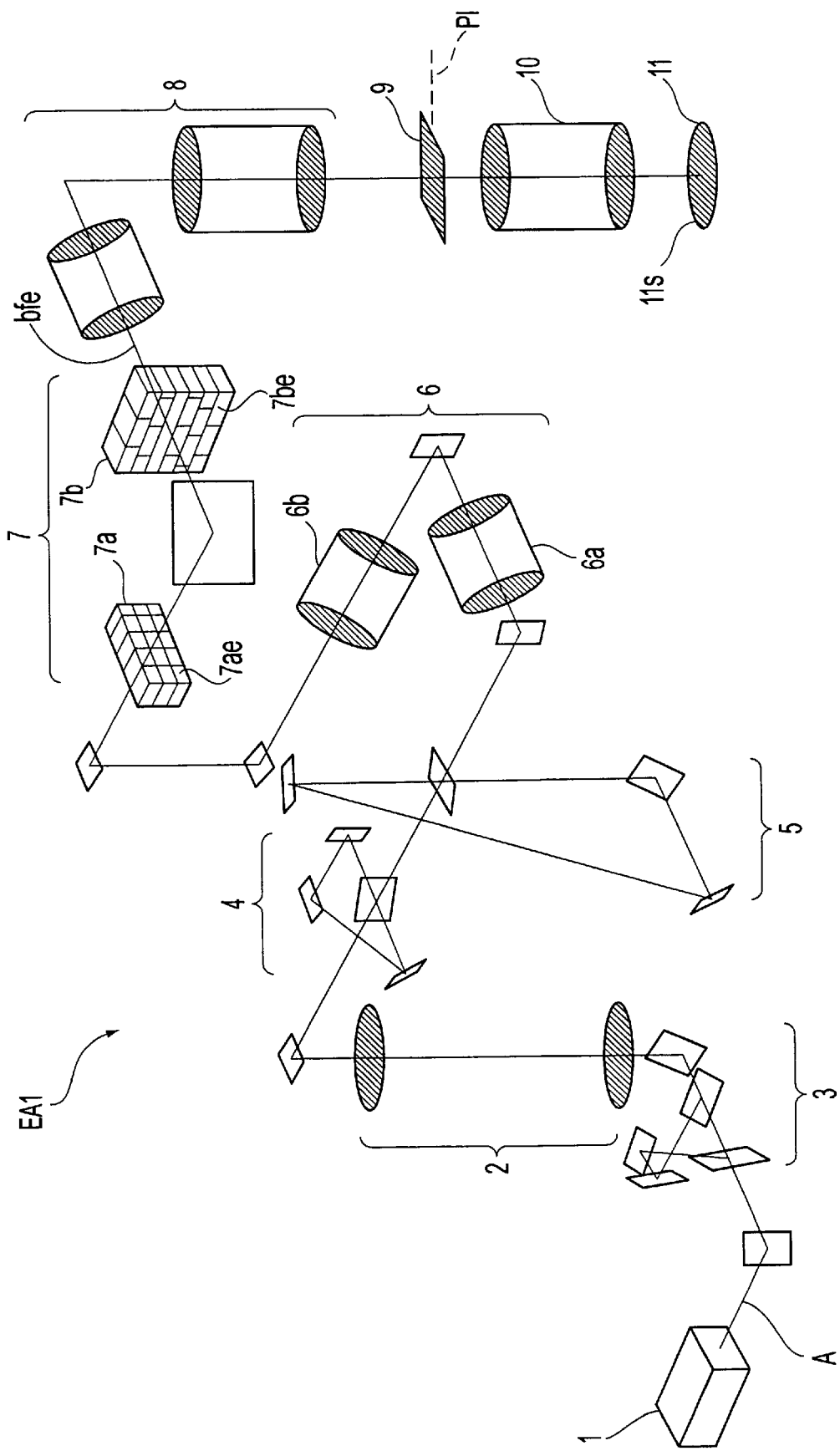
FIG. 8 is a schematic optical diagram of an exposure apparatus of the present invention which includes the illumination optical system of FIG. 1.

With reference to FIG. 8, an embodiment of an entire exposure apparatus EA1 for fabrication of semiconductor devices is presented in more detail below. The basic arrangement of the illumination optical apparatus of the present invention arranged within exposure apparatus EA1 is as described above for Embodiment 1 and apparatus IOA1. A relay lens 2 is provided between depolarizer 3 and first optical delay element 4, an expander optical system 6 is provided between second optical delay element 5 and fly-eye optical integrator 7. A condenser lens 8 is also arranged to the exit side of fly-eye optical integrator 7.

Expander optical system 6 comprises a cylindrical expander 6a and a conventional expander 6b. These allow the rectangularly shaped cross section of the beam from excimer laser 1 to be made square. Furthermore, fly-eye optical integrator 7 consists of a first fly-eye 7a and a second fly-eye 7b. First fly-eye 7a comprises a plurality of rectangularly shaped fly-eye lens elements 7ae arranged in regular fashion. Second fly-eye 7b comprises a plurality of rectangularly shaped fly-eye lens elements 7be arranged in irregular fashion. A light beam bfe exiting fly-eye optical integrator 7 is made to uniformly illuminate a reticle 9 arranged plane of illumination PI with Koehler illumination by means of the condenser lens 8. In addition, a wafer 11 with a surface 11S, which serves as the plane of exposure, is conjugate to reticle 9. Reticle 9 includes a pattern (not shown) which is transferred to surface 11S of wafer 11 by way of a projection objective lens 10. A magnification of ¼ or ⅕ is preferred. Actual exposure occurs as a result of scanning of reticle 9 and wafer 11.

A delay optical path length longer than the microscopic coherence length at the slit of the excimer leaser is ideally used. However, it is also possible to use a delay optical path length longer than the microscopic coherence length tcp at a position in the vicinity of the light source conjugate to an irradiation surface. This is because the light source images are superimposed by delay element(s). Accordingly, unwanted interference fringes and speckle will not appear so long as the delay optical path length is longer than the microscopic coherence length tcp at this location. Furthermore, the microscopic coherence length tcp at this location will in general be shorter than the microscopic coherence length at the slit, thus permitting attainment of a more practical configuration.

The several embodiments according to the present invention, as described above, permit substantial reduction of coherence to be carried out through the use of a simple constitution. Furthermore, substantial reduction of energy density is also carried out.

EMBODIMENT 3

Figure 10:
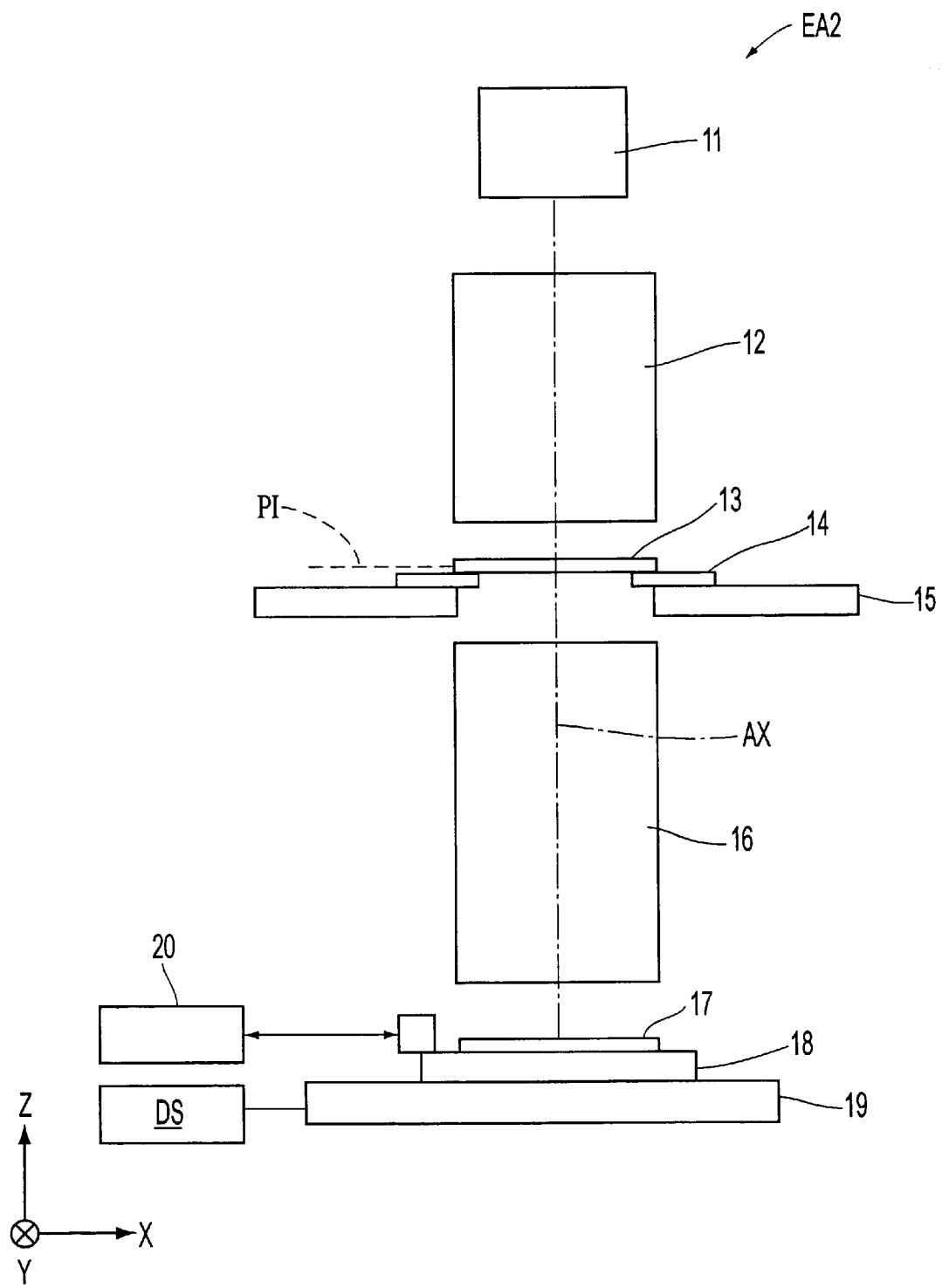
FIG. 10 is a schematic diagram of an exposure apparatus of the present invention equipped with an illumination optical apparatus associated with Embodiments 3 through 6 of the present invention.

FIG. 10 is a schematic optical diagram showing the constitution of an exposure apparatus EA2 equipped with an illumination optical apparatus associated with Embodiments 3 through 6, discussed here and below. Furthermore, FIG. 11 is a schematic optical diagram showing the constitution of the illumination optical apparatus associated with the present embodiments.

In FIG. 10, the Z-axis is parallel to optical axis AX of projection optical system 16. The X-axis is parallel to the plane of the paper in FIG. 10, and the Y-axis is perpendicular to the plane of the paper in FIG. 10 so as to define a plane perpendicular to optical axis AX.

Figure 11:
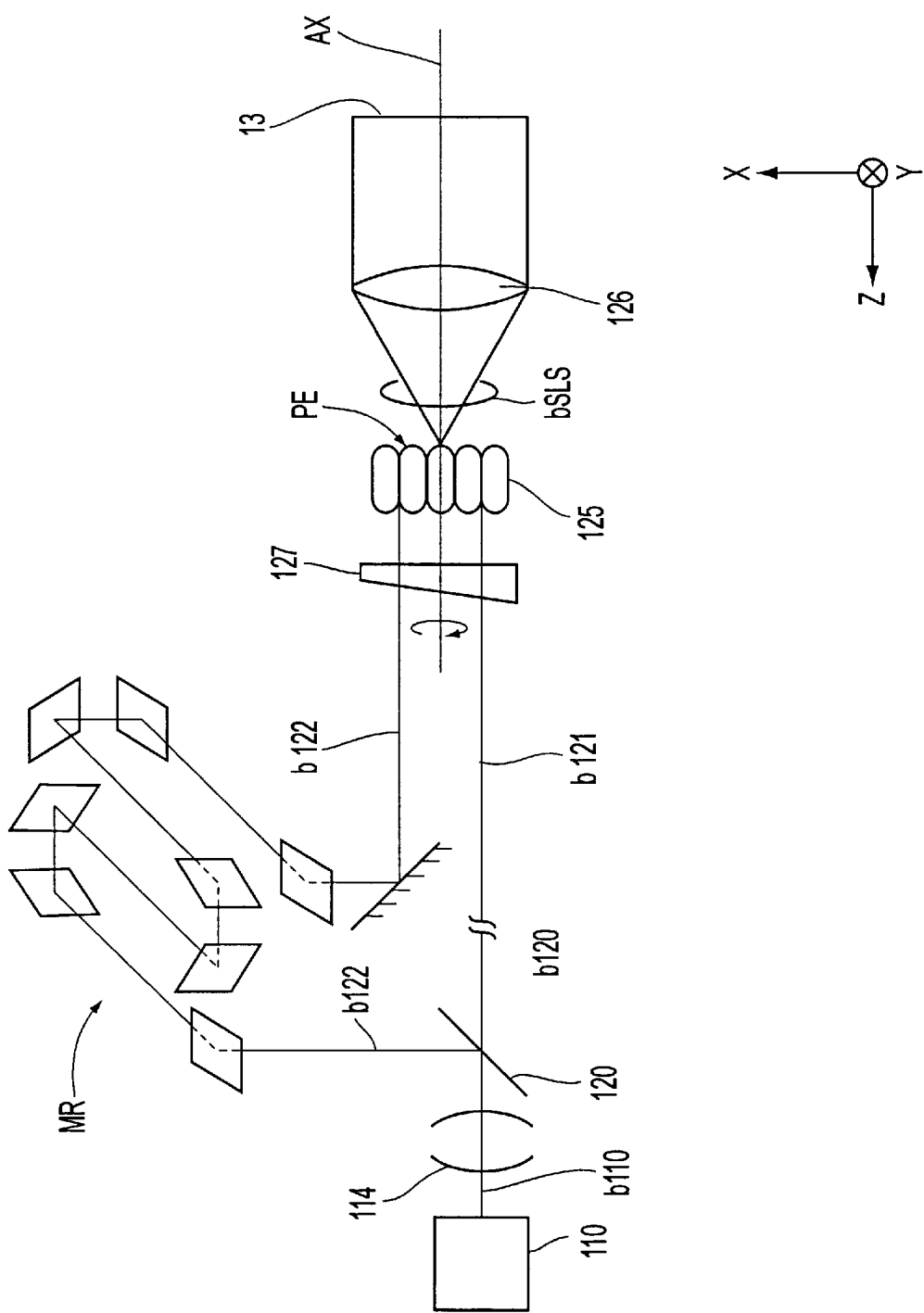
FIG. 11 is a schematic optical diagram of an illumination optical apparatus associated with Embodiment 3 of the present invention.

Accordingly, in FIG. 11, the Z-axis is in a direction normal to the plane of the pattern on the mask 13 arranged in plane of illumination PI, the X-axis is parallel to the plane of the paper in FIG. 11 and the Y-axis is perpendicular to the plane of the paper in FIG. 11, so as to define a plane perpendicular to the Z axis.

Exposure apparatus EA2 of FIG. 10 includes a light source 11, such as an excimer laser, that supplies light of wavelength, for example, 248 nm, 193 nm, or 157 nm. Light exiting light source 11 passes through an illumination optical system 12 and uniformly illuminates a mask 13 on which there is formed a prescribed pattern (not shown) to be transferred. Mask 13 is held parallel to the XY plane on a mask stage 15 by a mask holder 14. The internal structure and the action of light source 11 and illumination optical system 12 making up the illumination optical apparatus of Embodiment 3 are described below with reference to FIG. 11.

With continuing reference to FIG. 10, light from the pattern on mask 13 forms a mask pattern image on a wafer 17 (i.e., a photosensitive substrate), by way of a projection optical system 16. Wafer 17 is held parallel to the XY plane on a wafer stage 19 by way of a wafer holder 18. Wafer stage 19 is capable of two-dimensional movement in the plane (i.e., the XY plane) of wafer 17 as a result of the action of a drive system DS. The positional coordinates of drive system DS are measured by means of an interferometer 20 employing a mobile mirror and the constitution being such that positional control thereof is carried out.

Thus, drive system DS, interferometer 20, and so forth drive and control wafer 17 two-dimensionally within a plane (the XY plane) perpendicular to the optical axis AX of the projection optical system 16. In this manner, the pattern on mask 13 is sequentially transferred to respective exposure regions on wafer 17.

Referring now to FIG. 11, in the illumination optical apparatus of Embodiment 3, a main laser light beam b110 exits from light source 110 in the −Z direction and passes through a shaping optical system 114, which gives the beam the desired cross-sectional shape. Light beam b110 is thereafter incident a half mirror 120 which serves as a beam splitter. Light beam b110 is thus split into a first beam b120 that is transmitted through half mirror 120 and a second beam b122 that is reflected in the +X direction by half mirror 120. Moreover, though omitted from FIG. 11 so as to avoid unnecessarily complicating the drawing, beam b120 is split into two beams b121 and b123 (see FIG. 12) by way of another half mirror (not shown). The beam that is reflected by half mirror 120 is split into two beams b122 and b124 (see FIG. 13) by way of yet another half mirror (not shown).

Beam b121, which is transmitted through both half mirror 120 and another half mirror, travels along the Z-axis without being deflected by reflecting mirrors and so forth. Beam b121 is then incident a fly-eye lens 125 serving as optical integrator. Beam b123 (not shown) which is transmitted through half mirror 120 and is thereafter reflected by another half mirror, is led along an optical path which is bent by way of a plurality of reflecting mirrors and so forth, and travels along the Z-axis and is also incident fly-eye lens 125.

With continuing reference to FIG. 11, beam b122 is reflected in the +X direction by half mirror 120 and is thereafter transmitted through another half mirror. Beam b122 then travels along an optical path which is bent by way of a first plurality of reflecting mirrors MR and so forth. Beam b122 thereafter travels along the Z-axis and is incident fly-eye lens 125. Furthermore, beam b124 (not shown) is reflected by both half mirror 120 and another half mirror. This beam is also led along an optical path which is bent by way of a second plurality of reflecting mirrors and so forth (not shown), and thereafter travels along the Z-axis and is incident fly-eye lens 125.

Figure 12:
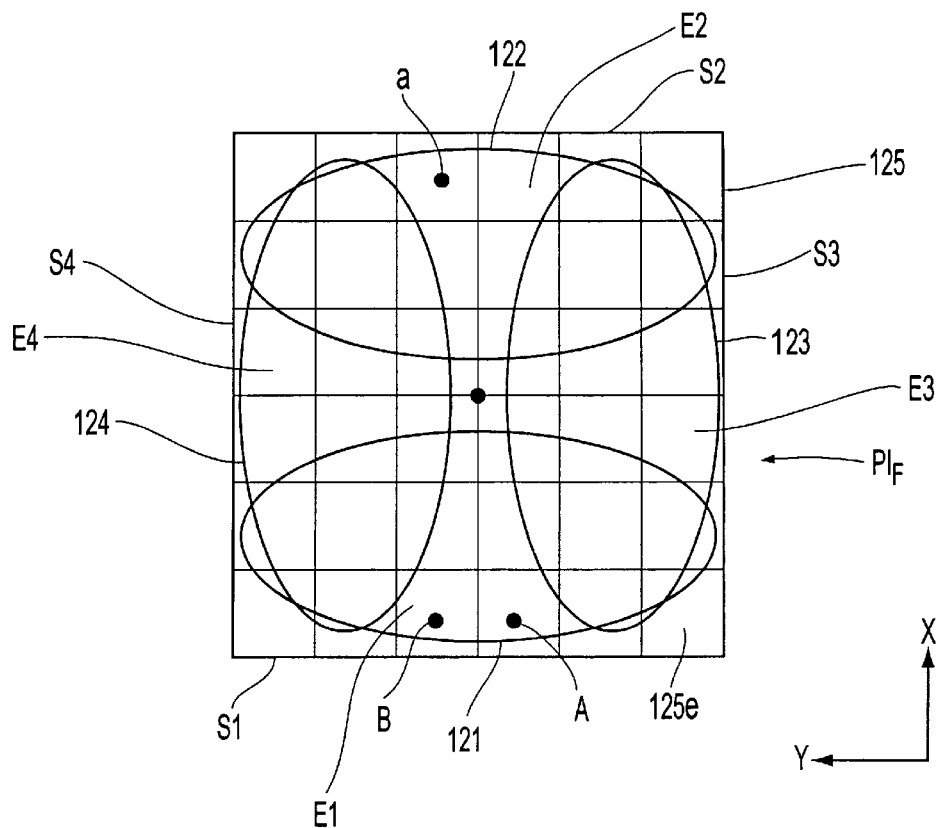
FIG. 12 is an end-on view of a fly-eye lens of Embodiment 3 of the illumination optical apparatus of FIG. 11 showing the locations at which respective beams are incident on the fly-eye lens, with the plane of incidence of the fly-eye lens being shown as viewed along the optical axis AX from the light source side.

FIG. 12 shows locations at which the respective beams b121–b124 are incident fly-eye lens 125. The plane of incidence of the fly-eye lens is shown as viewed along optical axis AX from the light source 110 side (see FIG. 11).

As shown in FIG. 12, beam b121 is incident plane of incidence $PI_F$ of fly-eye lens 125 at the elliptical region E1 at side S1 of fly-eye lens 125. Beam b122 is incident plane of incidence $PI_F$ at the elliptical region E2 at side S2 of fly-eye lens 125. Moreover, beam b123 is incident on plane of incidence $PI_F$ at the elliptical region E3 at side S3 of fly-eye lens 125. Beam b124 is incident plane of incidence $PI_F$ at the elliptical region E4 at side S4 of the fly-eye lens 125.

Figure 13:
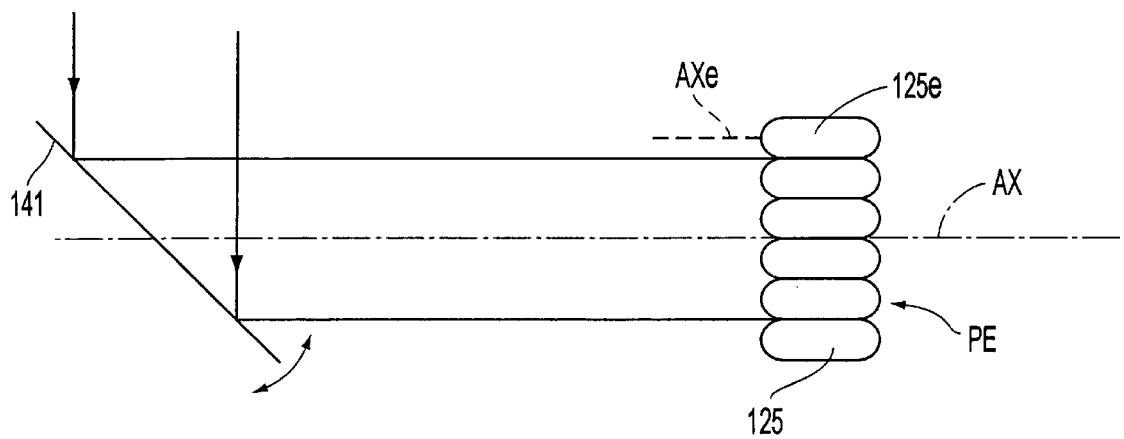
FIG. 13 is a schematic optical diagram of a section of the illumination optical system of FIG. 11, wherein a scanning mirror capable of free rotation is used in place of the wedge-shaped prism.

With reference now also to FIG. 13, fly-eye lens 125 comprises a plurality of positive lens elements 125e that have, for example, square cross sections and that are arrayed vertically and horizontally such that the central axes AXe thereof extend in directions parallel to optical axis AX. Accordingly, each of the respective beams incident the fly-eye lens 125 is split two-dimensionally by lens elements 125e, forming a multiplicity of light source images at the rear focal plane (which is to say, in the vicinity of the exit plane PE) of fly-eye lens 125. That is, a secondary light source (not shown) that is substantially a plane light source is formed at the rear focal plane of fly-eye lens 125. The intensity distribution of this secondary light source will vary as a finction of the cross-sectional shapes of the respective beams incident the plane of incidence of fly-eye lens 125, as well as the locations at which they are incident.

With reference again to FIG. 11, beams bSLS from the secondary light source, formed at the rear focal plane of fly-eye lens 125, pass through a condenser lens 126 and thereafter illuminate in superimposed fashion the patterned surface of mask 13. Field(s) of illumination which are square in shape and which resemble the cross sections of the respective lens elements of fly-eye lens 125 are thus formed at the patterned surface of the mask 13. Exit plane PE of fly-eye lens 125 and the entrance pupil plane (not shown) of projection optical system 16 are made more or less optically conjugate by means of condenser lens 126. Here, if there is coherence between any mutually different two of the four beams b121–b124, these two beams will interfere at the patterned surface of mask 13.

With reference to FIG. 12, as a specific example, consider a beam arriving by way of a lens element "A" illuminated by one beam b121 split off from main beam b110, and a beam arriving by way of a lens element "a" illuminated by another beam b122 different from beam b121. These beams will interfere at the patterned surface of mask 13 if there is coherence between any two of the four beams b121–b124.

Embodiment 1 is therefore constituted such that optical path lengths L121 through L124 of the four beams b121–b124 from half mirror 120 to plane of incidence PE of fly-eye lens 125 satisfy the following conditional expressions (4)–(6):

$$L121+tcp<L22 \quad (4)$$

$$L122+tcp<L23 \quad (5)$$

$$L123+tcp<L24 \quad (6)$$

Here, tcp is the temporal coherence length as determined based on the coherent light source microelements formed at light source 110, as described above.

As indicated above, in Embodiment 3, beams b121–b124 incident fly-eye lens 125 are respectively imparted with optical path length differences greater than the temporal coherence length tcp. Expressing this in more rigorous terms, any two arbitrary beams selected from among four beams b121–b124 must have an optical path length difference that is greater than the temporal coherence length tcp. Because the temporal coherence between any mutually different two beams of the four beams b121–b124 is therefore substantially eliminated, there will be substantially no interference between any two overlapping beams at the plane of incidence of fly-eye lens 125 or at the patterned surface of mask 13. Further, there will likewise be substantially no nonuniformity in illumination at mask 13 and wafer 17. Accordingly, exposure apparatus EA2 of Embodiment 3 permits attainment of a uniform illumination distribution and a projection optical system resolution that is suitable for the fine pattern being exposed and projected therein. Exposure apparatus EA2 also permits fabrication of satisfactory semiconductor devices under satisfactory exposure conditions.

Because the spatial coherence of an excimer laser beam is relatively low, there is little interference between two beams overlapping at mask 13 and arriving by way of two fly-eye lens elements illuminated by a single beam. However, with reference again to FIG. 11, in Embodiment 3 it is desirable that a wedge-shaped prism 127 constituted so as to allow free rotation about the optical axis AX be arranged adjacent the incident side of fly-eye lens 125. In such a case, rotation of wedge-shaped prism 127 will cause the angle(s) of incidence of the beams incident the respective lens elements 125e of fly-eye lens 125 to change with each pulse of the laser beam. This, in turn, imparts an optical phase difference between two beams arriving at mask 13 by way of two lens elements illuminated by a single beam.

As a result, there is reduced spatial interference between two beams overlapping at mask 13 and arriving by way of two lens elements illuminated by a single beam. This further uniformizes even the illumination distribution.

With reference to FIG. 13, a scanning mirror 141 capable of free rotation about an axis perpendicular to the plane of the paper may be used instead of wedge-shaped prism 127 to vary the angle(s) of incidence of the beams incident respective lens elements 125e of fly-eye lens 125 to achieve reduction in spatial interference.

EMBODIMENT 4

Figure 14:
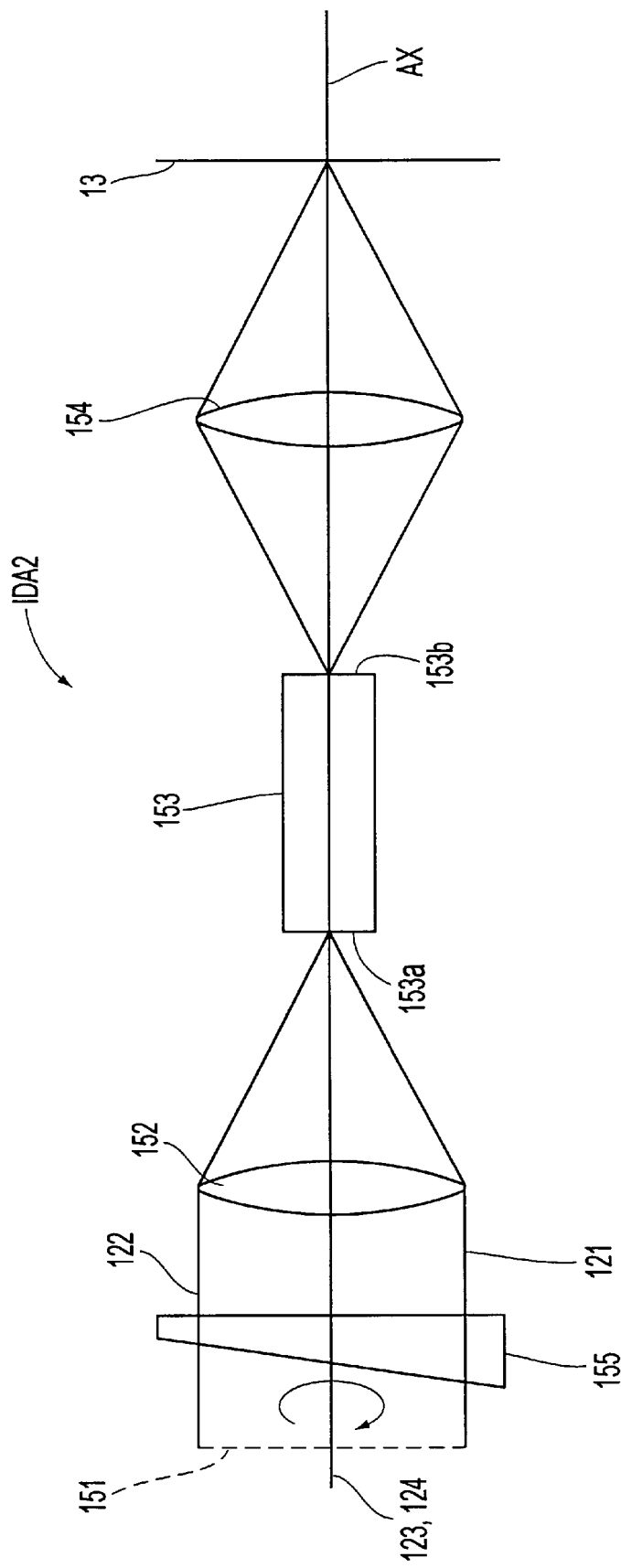
FIG. 14 is a schematic optical diagram showing the principal elements of an illumination optical apparatus associated with Embodiment 4 of the present invention.

FIG. 14 is a schematic optical diagram showing the constitution of the principal elements of an illumination optical apparatus IOA2 associated with Embodiment 4 of the present invention.

With reference to FIG. 14, Embodiment 4 has a constitution similar to that of Embodiment 3. The fundamental difference with respect to Embodiment 3 is that an internal-reflection-type rod (i.e., a light pipe) integrator 153 is used in place of fly-eye lens 125. Moreover, the constitution Embodiment 4 from the light source 110 to plane of incidence 151 (indicated by a dashed line in FIG. 14) of fly-eye lens 125, is similar to that of Embodiment 3. This portion is therefore not shown in FIG. 14. Below, Embodiment 4 is described with particular attention to the differences from Embodiment 3.

In illumination optical apparatus IOA2, to accommodate use of light pipe integrator 153 in place of fly-eye lens 125, a collection lens 152 is provided at the incident side of the light pipe integrator, and an imaging lens 154 is provided in place of condenser lens 126. The components are arranged such that the rear focal plane of collection lens 152 more or less coincides with the plane of incidence (i.e., most light-source-wise surface 153a) of light pipe integrator 153. Furthermore, the exit plane (i.e., surface 153b opposite surface 153a) of light pipe integrator 153 and the patterned surface of mask 13, which serves as the plane of illumination, are made more or less optically conjugate by means of imaging lens 154.

With continuing reference to FIG. 14, in Embodiment 4, the four beams b121–b124 are collected in the vicinity of surface 153a by collection lens 152. At this time, the several beams are respectively incident surface 153a of light pipe integrator 153 from different directions. Light pipe integrator 153 is an internal-reflection-type glass rod made of a glass such as quartz glass or fluorite. Total reflection at the interface between the interior and exterior thereof (i.e., at the internal surface thereof), is exploited to form a multiplicity of light source images in a plane parallel to surface 153a. Here, nearly all of the light source images formed are virtual images. The light source image formed at the center (collection point) is the only real image. That is, the beams incident light pipe integrator 153 are split into angular directions by total internal reflection, pass through a collection point, and form a secondary light source comprising a multiplicity of light source images in a plane parallel to surface 153a. Moreover, the intensity distribution of this secondary light source will vary as a function of the cross-sectional shapes of the respective beams incident surface 153a of light pipe integrator 153, as well as their incident angles with respect to surface 153a.

The beams from the secondary light source are superimposed at exit surface 153b. These beams thereafter uniformly illuminate the pattern on mask 13 by way of imaging lens 154. As described above, exit surface 153b and mask 13 (and consequently wafer 17) are made more or less optically conjugate by means of imaging lens 154. Accordingly, field(s) of illumination which are rectangular in shape and which resemble the cross section of light pipe integrator 153 are formed on mask 13.

Also in Embodiment 4, the four beams b121–b124 incident light pipe integrator 153 are respectively imparted with optical path length differences greater than the temporal coherence length tcp. Because temporal coherence between any mutually different two of the four beams b121–b124 is therefore substantially eliminated, there will be substantially no interference between any two overlapping beams at surface 153b of light pipe integrator 153, or the patterned surface of mask 13. Likewise, there will be substantially no nonuniformity in illumination at mask 13 and wafer 17. Moreover, to reduce spatial interference, it is desirable that a wedge-shaped prism 155, similar to that of wedge-shaped prism 127 of Embodiment 3, be arranged adjacent the incident side of collection lens 152. Further, wedge-shaped prism 155 should be made to rotate about the optical axis AX to cause the angle(s) of incidence of the light beams incident surface 153a to vary.

Embodiment 3 and Embodiment 4, per above, describe the present invention in terms of the example of an exposure apparatus equipped with an illumination optical apparatus. However, it is clear that the present invention may be applied in general to any illumination optical apparatus for providing uniform illumination. Further, the surface to be illuminated need not be a mask.

Also, in Embodiment 3 and Embodiment 4, above, the light source employed therein is a KrF excimer laser that supplies light of wavelength 248 nm, an ArF excimer laser that supplies light of wavelength 193 nm, or the like. However, it will be apparent to one skilled in the art that the present invention may also be applied to apparatus equipped with other type of light sources.

As described above, the aforesaid illumination optical apparatus impart, to a plurality of light beams incident an optical integrator, optical path length differences that are greater than the temporal coherence length as determined based on a local wavelength distribution at a prescribed location on a cross section of a light beam supplied from a light source. Thus, there will be substantially no interference between any two overlapping beams at the plane of incidence of an optical integrator such as a fly-eye lens or at a mask serving as plane of illumination. Likewise, there will be substantially no nonuniformity in illumination.

Accordingly, an exposure apparatus incorporating the illumination optical apparatus of the present invention will permit attainment of a uniform illumination distribution and a projection optical system resolution that is suitable for the fine pattern being exposed and projected therein. This permits fabrication of satisfactory semiconductor devices under satisfactory exposure conditions.

EMBODIMENT 5

Figure 15:
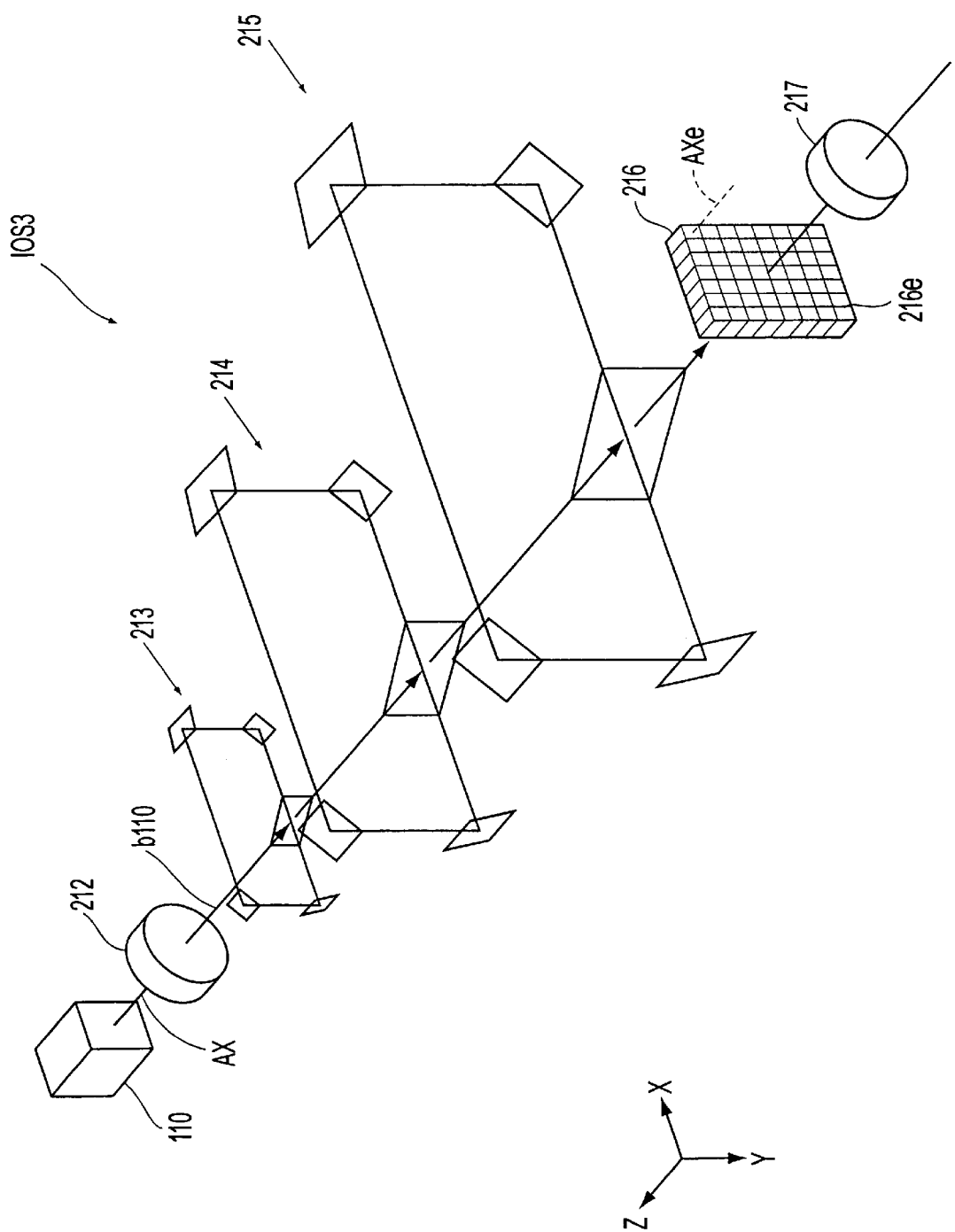
FIG. 15 is a schematic optical diagram of Embodiment 5 of the illumination optical apparatus of the present invention.

FIG. 15 is a schematic optical diagram (oblique view) showing the internal constitution of an illumination optical system IOS3 applicable to exposure apparatus EA2 of FIG. 10.

Referring now to FIG. 15 and illumination optical system IOS3, a light beam b110 is provided along optical axis AX from a light source 110 and is incident a beam shaping optical system 212. Optical system 212 may comprise, for example, a conventional expander having a pair of circular lenses, and a cylindrical expander comprising a pair of cylindrical lenses. After passing through optical system 212 and being given the desired cross-sectional shape, beam b110 passes through a first splitting delay stage (i.e., optical delay element) 213, through a second splitting delay stage (i.e., optical delay element) 214, and through a third splitting delay stage (i.e., optical delay element) 215. The beam is thereafter incident a fly-eye lens 216 which serves as an optical integrator. The constitution and action of first splitting delay stage 213 through third splitting delay stage 215 is described below.

Fly-eye lens 216 comprises a plurality of lens elements 216e that have, for example, rectangular cross sections and positive refracting power. Elements 216e are arrayed vertically and horizontally such that the central axes AXe thereof are parallel to optical axis AX. Accordingly, a beam incident fly-eye lens 216 is split two-dimensionally by lens elements 126e, forming a secondary light source (not shown) comprising a multiplicity of light source images at the rear focal plane thereof The beams from the secondary light source formed at the rear focal plane of the fly-eye lens 216 pass through condenser lens 217 and thereafter illuminate in superimposed fashion the pattern on mask 13 (see FIG. 10).

Figure 16:
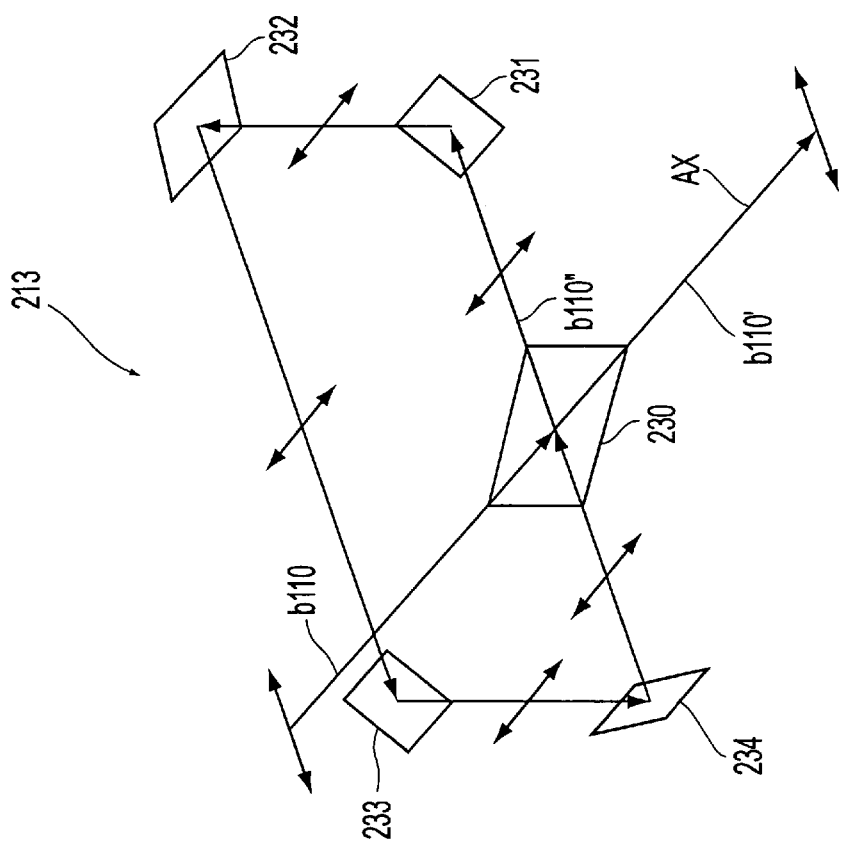
FIG. 16 is a close-up view of the first splitting delay stage of the illumination optical apparatus of FIG. 15.
Figure 16:
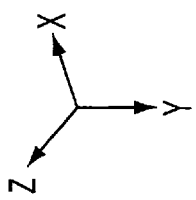
Figure 17:
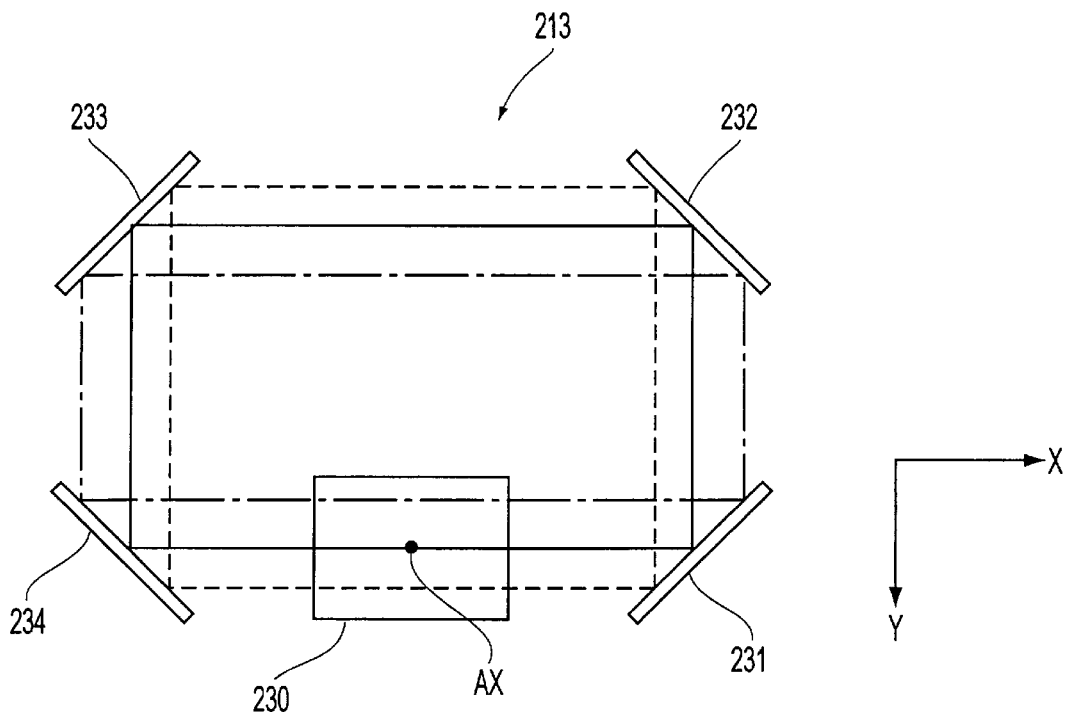
FIG. 17 is a schematic optical diagram describing the action of the delay optical path in the first splitting delay stage of the illumination optical apparatus of FIG. 15.
Figure 18:
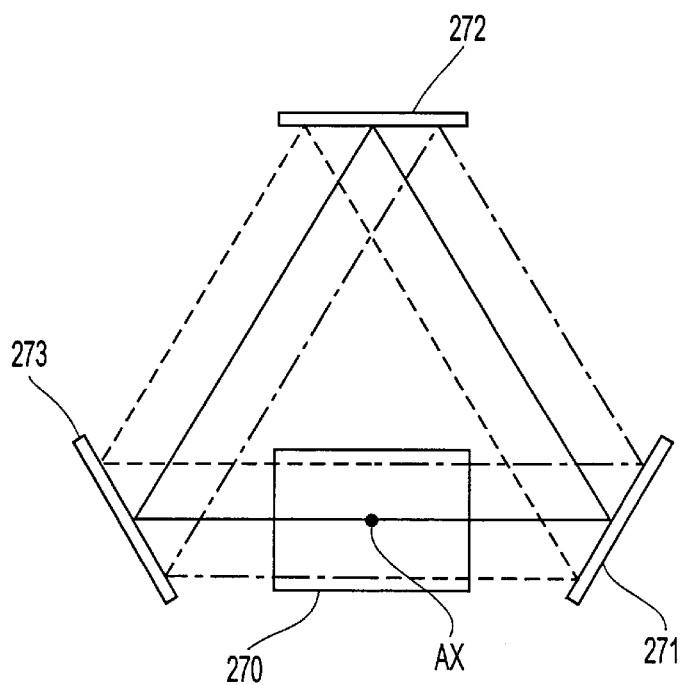
FIG. 18 is schematic optical diagram showing the defects of a delay optical path of a splitting delay stage that is triangular in shape through the use of three reflecting mirrors in a splitting delay stage.

FIG. 16 is an oblique enlarged view showing the constitution of the first splitting delay stage 213. FIG. 17 is a schematic optical diagram setting forth the action of the delay optical path in first splitting delay stage 213.

With reference first to FIG. 16, the first splitting delay stage 213 includes a half mirror 230 arranged so as to be inclined at an angle of 45° with respect to optical axis AX. Accordingly, a light beam traveling along optical axis AX and incident half mirror 230 is split into a beam b110' that is transmitted through half mirror 230, and a beam b110" that is reflected in the +X direction by half mirror 230. Beam b110' travels along optical axis AX and is incident second splitting delay stage 214.

On the other hand, beam b110" is reflected in the −Y direction by a first reflecting mirror 231, is reflected in the −X direction by a second reflecting mirror 232, is reflected in the +Y direction by a third reflecting mirror 233, and is reflected in the +X direction by a fourth reflecting mirror 234. Beam b110" thereafter returns to half mirror 230. Beam b110" is then split into a beam that is transmitted through half mirror 230 and a beam that is reflected in the −Z direction by half mirror 230. The beam that is reflected in the −Z direction by half mirror 230 travels along optical axis AX and is incident second splitting delay stage 214. On the other hand, the beam that is transmitted through half mirror 230 is reflected by reflecting mirrors 231–234 and thereafter again returns to half mirror 230.

In the foregoing description, we considered only the light beams split by way of the first splitting delay stage 213 through the third splitting delay stage 215 that have an energy of 1% or greater. However, for light beams having energies of, say, 0.1% or greater, the first splitting delay stage 213 through the third splitting delay stage 215 would be found to further temporally split a light beam incident along the optical axis AX on first splitting delay stage 213 into a further multiplicity of light beams.

Also, in the foregoing description, we assumed a reflectance of 50% was assumed for the half mirrors. However, it is common for the reflectance be set between approximately 33% and 50%.

In the present embodiment, for the temporal coherence length the macroscopic temporal coherence length tc as determined based on the wavelength distribution of the macroscopic light source was not used. Instead, a microscopic temporal coherence length tcp as determined based on the wavelength distribution within a prescribed spatial resolution was used. Also, the optical path length d of the delay optical path in the rectangularly shaped first splitting delay stage 213 is set such that it is not less than microscopic temporal coherence length tcp. The reason for using microscopic temporal coherence length tcp in the present embodiment is that a multiplicity of exit slit images (light source images) are formed at the rear focal plane of the fly-eye lens. In cases where the imparted optical path length difference d is on the same order as the macroscopic temporal coherence length tc, light from respective slit images separated by an arbitrarily sized spatial resolution will mutually interfere. This interference will cause occurrence of interference fringes and speckle patterns at the plane of the mask and at the plane of the wafer.

As described above, in the present embodiment, a splitting delay means comprising the first splitting delay stage 213 through the third splitting delay stage 215 generates a plurality of light beams produced by temporal splitting. Any two temporally consecutive light beams are imparted with an optical path length difference d set so as to be not less than the microscopic temporal coherence length tcp. Accordingly, coherence in the wavetrains produced as a result of splitting by first splitting delay stage 213 through the third splitting delay stage 215 can be reduced. Interference fringes and speckle patterns at the plane of the mask serving as the plane of illumination and at the plane of the wafer can thus be satisfactorily controlled.

In each of splitting delay stages 213–215 of the present embodiment, the delay optical path therein is formed in the shape of a rectangle by an even number of (to wit, four) reflecting mirrors. Thus, even if the light beam incident thereon should become misaligned in parallel fashion with respect to optical axis AX, the optical paths of the successively generated series of light beams will not become misaligned with respect to one another but will remain constant. For example, the light beam incident on the first splitting delay stage 213 may become misaligned in parallel fashion with respect to the optical axis AX due to the influence of, for example, vibration of the apparatus or the like. Nevertheless, the optical paths of the series of light beams successively generated by way of the splitting delay means comprising the first splitting delay stage 213 through the third splitting delay stage 215 will not become misaligned with respect to one another. As a result, the illumination optical apparatus of the present embodiment has high stability with respect to vibration and it is easy to carry out optical adjustments thereon.

In each of the splitting delay stages of the above embodiment, a relay optical system for making the beam-splitting surface of the half mirror representing the entrance end of the delay optical path optically conjugate to the beam-splitting surface of the half mirror representing the exit end of the delay optical path may be arranged in the delay optical path therein. This will allow constitution of optical system in which a large effect on performance does not easily occur as a result of angular misalignment with respect to the reference optical axis of a light beam incident on a half mirror.

Furthermore, in each of the splitting delay stages in illumination optical apparatus IOA3, the delay optical path therein is formed in the shape of a rectangle. However, the optical paths of the successively generated series of light beams will become slightly misaligned due to the thickness of the half mirror therein, due to the action of refraction at the half mirror. For this reason, it is desirable that a parallel plate having the same thickness as the half mirror and acting as a compensator to compensate for misalignment due to the half mirror thickness be arranged perpendicularly with respect to the half mirror in the optical path between the fourth reflecting mirror and the half mirror (e.g., between mirror 231 and half mirror 230; see FIG. 16).

In addition, in each of the splitting delay stages of the above embodiment, the optical path lengths of the delay optical paths have been varied as d, 2d, and 3d. However, the manner of varying these paths is not so limited. It is possible, fot example, to set the optical path lengths of the second splitting delay stage and the third splitting delay stage to suitable integral multiples of d.

Furthermore, in the above embodiment, the splitting delay means includes three splitting delay stages. However, the number of stages is not so limited, and it is possible for the splitting delay means to consist of one or of a plurality of such splitting delay stages.

In each of the splitting delay stages 213–215 of illumination optical apparatus IOA3, four reflecting mirrors form a rectangularly shaped delay optical path. However, as is also indicated in a variation to be described below, the effect of the present invention can still be exhibited even if the delay optical path is formed using two or more reflecting members in a shape other than a rectangle. Moreover, the effect of the present invention can still be exhibited even if the delay optical path is formed using, for example, six reflecting members in a three-dimensional configuration. That is, in the present invention, to achieve a constitution that will prevent the optical paths of the series of light beams successively generated by way of the splitting delay means from becoming mutually misaligned due to the influence of, for example, vibration of the apparatus or the like, it is only necessary that the delay optical path thereof be such that a light beam therein is deflected an even number of times.

Figure 19:
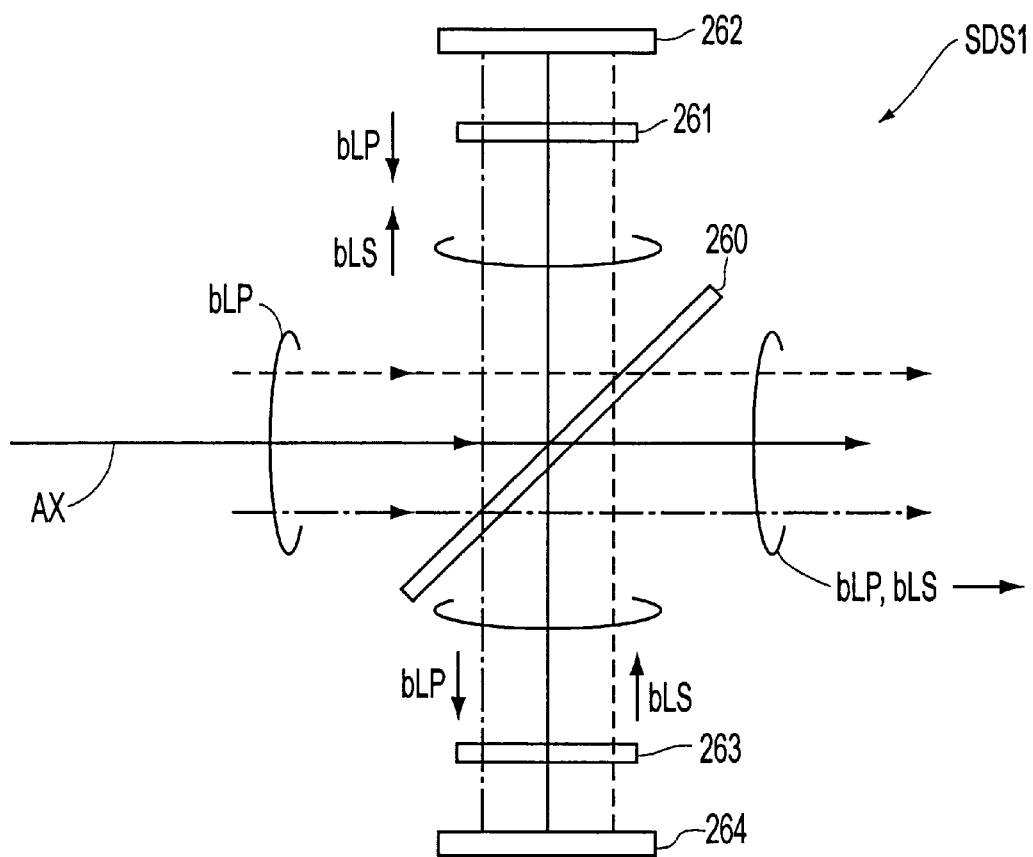
FIG. 19 is a schematic optical diagram of an alternate embodiment of a splitting delay stage for use in the illumination optical apparatus of FIG. 15.

FIG. 19 is a schematic optical diagram showing the constitution of a variation on the several splitting delay stages in the illumination optical apparatus of the present invention.

With reference to FIG. 19, splitting delay stage SD1 of the variation is equipped with a polarizing beam splitter mirror 260 arranged at an angle of 45° with respect to the optical axis AX. Accordingly, a linearly polarized light beam bL traveling along optical axis AX and incident polarizing beam splitter mirror 260 will be split into a P-polarized light beam bLP that is transmitted through the polarizing beam splitter mirror 260 and an S-polarized light beam bLS that is reflected in the +X direction by the polarizing beam splitter mirror 260. Here, the polarization direction of light beam bL incident polarizing beam splitter mirror 260 can be set so as to attain desired values for the relative intensities of transmitted P-polarized light beam bLP and reflected S-polarized light beam bLS.

The P-polarized light beam bLP exits the splitting delay stage along optical axis AX. The S-polarized light beam bLS passes through a first quarter-wave plate 261 and is incident first reflecting mirror 262 having a reflecting surface parallel to the YZ plane. Light beam bLS, being reflected in the −X direction by the first reflecting mirror 262, becomes P-polarized upon passing through first quarter-wave plate 261, and is incident polarizing beam splitter mirror 260. This light beam is transmitted through polarizing beam splitter mirror 260, and is incident, by way of a second quarter-wave plate 263, on a second reflecting mirror 264 having a reflecting surface parallel to the YZ plane. This light beam, being reflected in the +X direction by the second reflecting mirror 264, becomes S-polarized by way of second quarter-wave plate 263, and is incident polarizing beam splitter mirror 260. This S-polarized light beam, being reflected by polarizing beam splitter mirror 260, exits the splitting delay stage along optical axis AX.

Thus, the delay optical path in splitting delay stage SDS1 is such that reflecting mirrors 262 and 264 therein define a rectilinear round-trip optical path. That is, this delay optical path consists of the rectilinear optical path from polarizing beam splitter mirror 260 to first reflecting mirror 262, the rectilinear optical path from first reflecting mirror 262 to second reflecting mirror 264, and the rectilinear optical path from second reflecting mirror 264 to polarizing beam splitter mirror 260. Thus, in splitting delay stage SDS1, a light beam incident thereon along optical axis AX is temporally split into light beams bLP and bLS, permitting an optical path length difference equal to optical path length of the delay optical path being imparted to these two light beams.

As indicated by a dashed line and by an alternate short and long dashed line in FIG. 19, in splitting delay stage SDS1, the location at which a light beam is originally incident polarizing beam splitter mirror 260 will be coincident with the location at which the light beam is finally incident polarizing beam splitter mirror 260 after completing its pass through the delay optical path. This is true even if the light beam incident polarizing beam splitter mirror 260 should become misaligned parallel with respect to optical axis AX. As a result, even if the light beam bLP incident on splitting delay stage SDS1 should become misaligned parallel with respect to optical axis AX due to the influence of, for example, vibration of the apparatus or the like, the optical paths of any two light beams successively generated by way of the splitting delay stage will not become misaligned with respect to one another.

Accordingly, an effect similar to that of illumination optical apparatus IOA3 can be obtained even if three splitting delay stages (wherein the optical path lengths of the delay optical paths therein are set in accordance with those of the embodiment) having constitutions which are fundamentally the same as that of SDS1 are used in place of the several splitting delay stages 213 through 215 in illumination optical apparatus IOA3. However, note that in the case of three splitting delay stages like SDS1, the light beam incident thereon along the optical axis AX will be temporally split into six light beams, unlike splitting delay stages 213–215.

A thin film that reflects excimer laser light is vapor-deposited on the front-side reflecting surfaces of the reflecting mirrors in the several splitting delay stages of splitting delay states 213–215 and SDS1. However, as they are at present these front-side reflecting surfaces will be incapable of reflecting visible light with a desired reflectance. Accordingly, when using an autocollimator utilizing visible light to adjust deflection angle or the like at the several reflecting mirrors, it is not possible to carry out adjustment by moving ("tweaking") the actual reflecting mirrors themselves. Rather, it is necessary to use a special setup mirror that reflects visible light to make the adjustment and thereafter replacing this setup mirror with the actual reflecting mirror. During this exchange of mirrors, it is easy for a discrepancy to arise between the deflection angle of the setup mirror that was adjusted and that of the actual reflecting mirror that is exchanged therewith. It is therefore desirable to vapor-deposit on the back-side reflecting surfaces of the several reflecting mirrors in splitting delay stages 213–215 and SDS1 a reflective film that primarily reflects visible light such as, for example, green light. If this is done, it will be possible to carry out optical adjustments more easily, without the need to exchange the actual reflecting mirrors with a special setup mirror, simply by directing visible light into the illumination optical path.

Moreover, while we have in the above embodiment used a KrF excimer laser as a light source, it is possible to employ an ArF excimer laser, or any other such coherent light source. However, if an ArF excimer laser or a light sources having a wavelength shorter than that of an ArF laser is used, reflecting mirror reflectance will be reduced to some degree. Accordingly, it will be advantageous from the standpoint of reducing optical losses to employ 45° prisms comprising fluorite or quartz, such as are shown in FIG. 7, to bend the delay optical path through utilization of total internal reflection.

If the illumination optical apparatus of the present invention is employed in an exposure method for fabrication of semiconductor devices, it will be possible to carry out projection and exposure under satisfactory illumination conditions that are not easily disturbed by vibration and wherein there is little nonuniformity in illumination. Thus, fabrication of satisfactory semiconductor devices will be permitted.

In the above embodiment described the present invention in terms of an example of a projection exposure apparatus equipped with an illumination optical apparatus, it is clear that the present invention may be applied in general to any illumination optical apparatus for uniform illumination. Further, and the surface to be illuminated need not be a mask.

Also, in describing splitting delay stages 213–215 and SDS1, the light sources such as a KrF excimer laser that supplies light of wavelength 248 nm, an ArF excimer laser that supplies light of wavelength 193 nm, or the like, were considered. However, the present invention may also be applied to apparatus equipped with coherent light sources other than these, such as for example an $F_2$ laser light source or the like.

Moreover, while the above embodiment employed as optical integrator a fly-eye lens wherein a plurality of lens elements are arrayed in the form a matrix, the optical integrator of the present invention is not limited to fly-eye lenses. For example, it being possible to employ a light pipe integrator. In this latter case, it is preferable that the splitting delay means of the present invention be arranged in the optical path between the light source and the light pipe integrator.

EMBODIMENT 6

Figure 1:
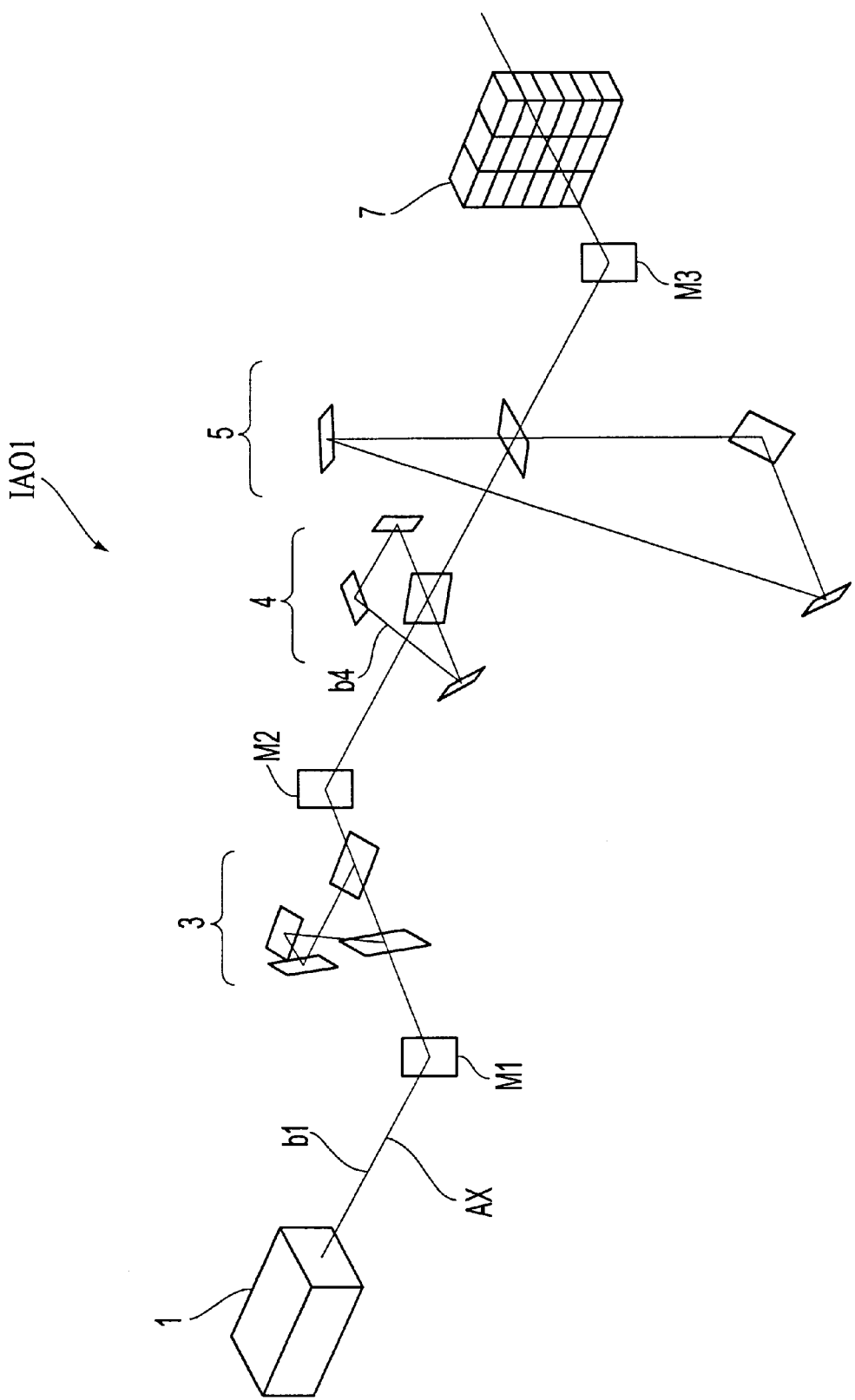
FIG. 1 is a schematic optical diagram of an illumination optical apparatus according to Embodiment 1 of the present invention.
Figure 20:
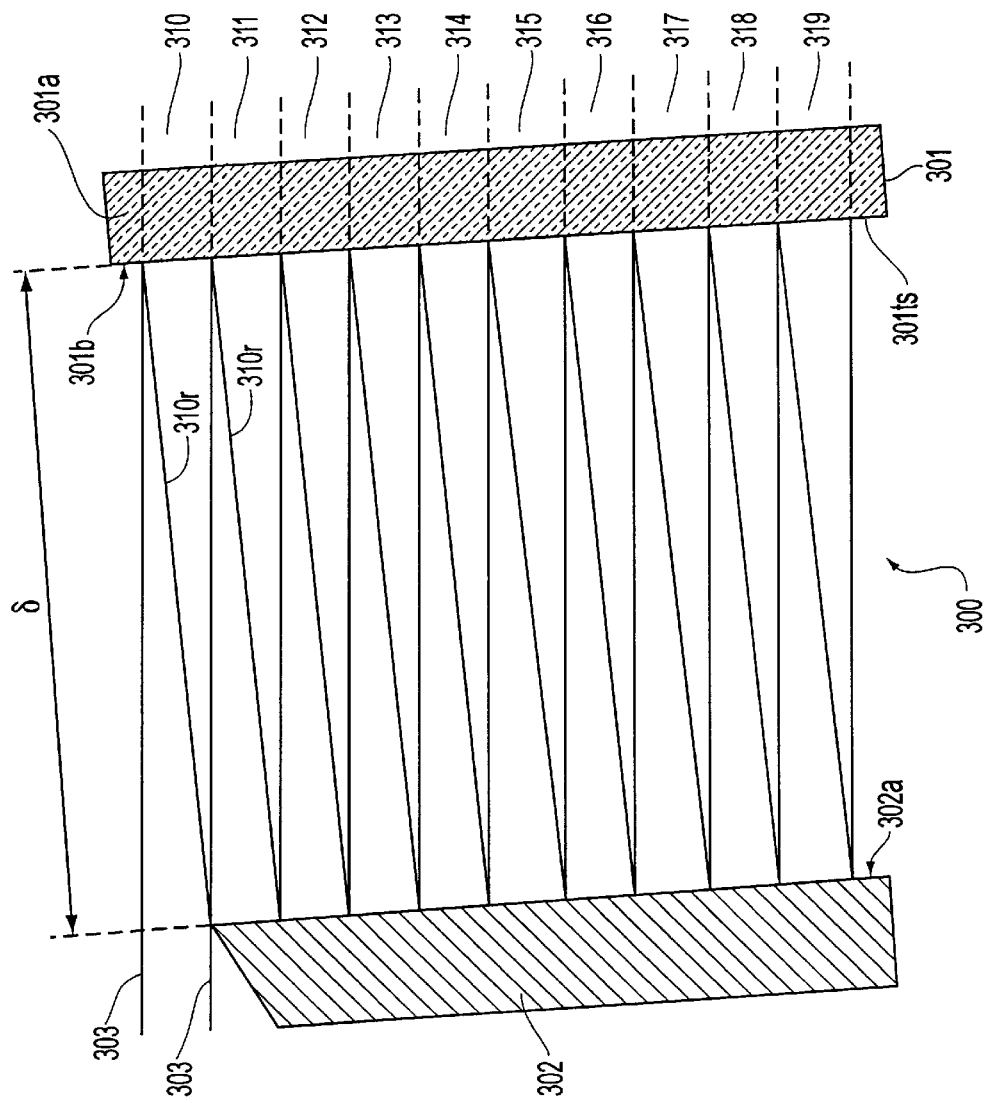
FIG. 20 is schematic optical diagram of a section of an illumination optical apparatus associated with Embodiment 6 of the present invention.

With reference now to FIG. 20, an optical delay element 300 is arranged between a light source and an optical integrator (see, e.g., FIG. 1). This optical delay element 300 has a partially reflective mirror 301 having a transparent support 301a and a partially reflective layer 301b formed on front surface 301f of the transparent support, and a plane mirror 302 having a reflective front surface 302a.

In FIG. 20, laser light 303 from a light source (not shown) is incident partially reflective mirror 301 at an angle nearly perpendicular with respect thereto (e.g., on the order of 4° with respect to the partially reflective mirror surface normal), and is split amplitude-wise at the partially reflective layer 301b into a transmitted component (fractional beam) 310 and a reflected component 310r. Reflected component 310r is directed at the reflective surface 302a, which is positioned so as to be parallel to the partially reflective layer 301b, and is reflected reflective surface 302a, upon which it is redirected toward a region on the partially reflective layer 301b adjacent transmitted component 310. This light from the reflective surface 302a is likewise split amplitude-wise at the partially reflective surface. The transmitted component exiting therefrom is fractional beam 311. As a result of repeated reflection in this manner between partially reflective layer 301b and reflective surface 302a, the laser light 303 from the light source is split into fractional beams 310 through 319. At this time, between fractional beams 310 and 311 there will be an optical path length difference that is approximately twice the axial distance δ between the partially reflective layer 301b and the reflective surface 302a. Likewise, between any two neighboring fractional beams there will be an optical path length difference that is approximately twice the distance between partially reflective layer 301b and reflective surface 302a.

In the present embodiment, the optical path length difference between any two neighboring fractional beams is set so as to be not less than the coherence length of the coherent light source microelements within the light source. In other words, the optical path length difference between any two of these neighboring fractional beams is set so as to be greater than the temporal coherence length as determined based on a local wavelength distribution at a prescribed location on a cross section of a light beam supplied from the light source. Moreover, in the above embodiment, reflectance of partially reflective layer 301b is made to vary locally so as to make the light intensities of several fractional beams 310 through 319 substantially equal. Furthermore, two optical delay elements 300 as shown in FIG. 20 may be provided, one being arranged such that it is rotated 90° about the optical axis from the other.

A wafer which has undergone an exposure operation (photolithographic operations) by means of an exposure apparatus according to any one of the above-described several embodiments undergoes a develop operation. Thereafter the wafer undergoes an etching operation in which areas other than those at which resist remains after develop are removed. A resist stripping operation is then performed to remove the resist that is no longer necessary following completion of the etching operation. Other operations are performed as well until wafer processing is completed. Following completion of wafer processing, a semiconductor device (LSI or the like) is ultimately manufactured during the course of actual assembly operations such as a dicing operation, wherein the wafer is cut into chips such that each such chip comprises one of the circuits exposed thereon. A bonding operation is then performed, wherein each chip is provided with electrical leads and the like. A packaging operation is finally performed, wherein each chip is separately packaged, and so forth.

The above description is in terms of an example of fabrication of a semiconductor device by means of wafer processing through a photolithographic operation employing a projection exposure apparatus. Some of the semiconductor devices which may be fabricated by means of a photolithographic operation employing an exposure apparatus include liquid crystal display elements, thin-film magnetic heads, and image pickup elements (CCD elements and the like).

As described above, the illumination optical apparatus of the present invention permits adequate reduction of coherence to be carried out even when a coherent light source is used, and is highly stable with respect to vibration and permits easy optical adjustment.

Accordingly, an exposure apparatus incorporating the illumination optical apparatus of the present invention will be capable of carrying out satisfactory projection and exposure, having illumination non-uniformity due to interference and having satisfactory illumination conditions that are not easily disturbed by vibration. Furthermore, an exposure method wherein the illumination optical apparatus of the present invention is employed to expose a pattern of a mask arranged in the plane of illumination. This makes it possible to carry out projection and exposure under conditions of satisfactory illumination, and to fabricate satisfactory semiconductor devices therewith.

While the present invention has been described in connection with preferred embodiments, it will be understood that it is not limited to those embodiments. On the contrary, it is intended to cover all alternatives, modifications and equivalents as may be included within the spirit and scope of the invention as defined in the appended claims.

What is claimed is:

1. An illumination optical apparatus comprising:
   a) a coherent light source capable of providing a first light beam with a coherence length along a first optical path; and
   b) a first optical delay element capable of splitting, by a splitting member, from said first light beam a second light beam having a first delay optical path with a first path length not less than said coherence length, wherein said first delay optical path returns to said first optical path a first deflection angle at said splitting member of said first optical delay element and wherein said first delay optical path is contained in a plane which extends across said first light beam entering into said splitting member.

2. An illumination optical apparatus according to claim 1, wherein said second light beam makes one or more passes over said optical delay path, and wherein said first optical delay element is designed so as to cause an incremental change of said first deflection angle with each pass of said second light beam therethrough.

3. An illumination optical apparatus according to claim 2, wherein:
   a) said first optical delay element includes a first exit direction associated with said first light beam exiting said first optical delay element;
   b) the apparatus firther includes a second optical delay element having a second deflection angle and a second exit direction associated with a third light beam exiting said second optical delay element;
   c) wherein said first exit direction and said second exit direction are different.

4. An illumination optical apparatus according to claim 1, wherein said first optical delay element includes a polarizing beam splitter that splits said second light beam from said first light beam, and a plurality of reflecting mirrors which reflect the second light beam, said polarizing beam splitter corresponding to said splitting member.

5. An illumination optical apparatus according to claim 1, wherein:
   a) the illumination optical apparatus includes (m−1) additional optical delay elements for a total of m optical delay elements, m being an integer equal to 2 or greater;
   b) a depolarizer arranged between said light source and a most light-source-wise optical delay element, said depolarizer having an S-polarized delay length L associated with S-polarized light;
   c) said first optical delay element has a delay optical path of $2n \times L$, where n is an integer;
   d) said second optical delay element has a delay optical path of $6n \times L$; and
   e) said mth optical delay element has a delay optical path of $2 \times m^2 \times L$.

6. An illumination optical apparatus according to claim 1, wherein:
   a) the illumination optical apparatus includes a second optical delay element;
   b) said first optical delay element has a first light beam splitting member having a first plane of incidence, for splitting said first light beam into said second light beam, and a first reflecting member having a second plane of incidence upon which said second light beam is incident;
   c) said second optical delay element includes a second light beam splitting member having a third plane of incidence, for splitting a third light beam incident thereon to form a fourth light beam, and a second reflecting member having a fourth plane of incidence upon which said fourth light beam is incident; and
   d) said first plane of incidence being arranged so as to be perpendicular to said second plane of incidence, and said third plane of incidence being arranged so as to be perpendicular to said fourth plane of incidence.

7. An illumination optical apparatus according to claim 6, wherein said first light beam splitting member is a first half mirror, said second light beam splitting member is a second half mirror, said first and second half mirrors being arranged perpendicular to one another.

8. An illumination optical apparatus according to claim 4, wherein said first light beam includes a first wavelength, and wherein each of said reflecting mirrors has first and second surfaces, said first surfaces each having a first thin film that primarily reflects said first wavelength, and said second surfaces having a second thin film that primarily reflects a second wavelength of light different from said first wavelength.

9. An illumination optical apparatus according to claim 1, wherein said first optical delay element includes a prism made of quartz or fluorite, and wherein said first delay optical path is bent via total internal reflection.

10. An illumination optical system comprising in order along an optical axis:
   a) a coherent light source for generating a first coherent light beam along a first optical path;
   b) a first optical delay element having a light beam splitting member that splits a second light beam from said first coherent light beam and directs said second light beam to a first delay optical path wherein:
   said first delay optical path returns to said first optical path at a first deflection angle at said splitting member,
   said first delay optical path is contained in a plane which extends across said first coherent light beam entering into said splitting member, and
   a plurality of reflecting members are located in said plane.

11. An illumination optical apparatus according to claim 10, further comprising a second optical delay element located in series with said first optical delay element.

12. An illumination optical apparatus capable of illuminating a surface to be illuminated, comprising:
   a) a coherent light source capable of providing a first light beam having a coherence length along a first optical path;
   b) a first optical delay element capable of splitting, by a splitting member, from said first light beam a second light beam having a first delay optical path with a first path length not less than said coherence length, wherein said first delay optical path returns to said first optical path at a first deflection angle at said splitting member of said first optical delay element and wherein said first delay optical path is contained in a plane which extends across said first light beam entering into said splitting member;
   c) an optical integrator that forms a first plurality of light beam source images and a second plurality of coherent light beams from said first plurality of coherent light beams; and
   d) a condenser optical system that condenses said second plurality of coherent light beams so as to illuminate the surface.

13. An illumination optical apparatus according to claim 12, wherein said light source is an excimer laser light source, and said coherence length is determined based on a wavelength distribution at the center of a cross section of said first coherent light beam.

14. An illumination optical apparatus according to claim 12, wherein said optical integrator includes a fly-eye lens having a plane of incidence and an array of lens elements, and wherein each light beam in said first plurality of coherent light beams is incident at respectively different locations on said plane of incidence.

15. An illumination optical apparatus according to claim 12, wherein said optical integrator includes a light pipe integrator having a plane of incidence, and each light beam in said first plurality of light beams is incident said plane of incidence at respectively different locations.

16. An illumination optical apparatus comprising:
    a) a light source capable of providing a first coherent light beam having a temporal coherence length;
    b) a splitting delay apparatus having a beam splitter that causes a portion of said first coherent light beam incident a first location thereon along a reference optical axis to exit said splitting delay apparatus as a second coherent light beam that is substantially coincident with said reference optical axis while causing a portion of the light beam incident thereon along said reference optical axis to exit therefrom as a second light beam traveling along a second optical axis having a direction different from said reference optical axis;
    c) a delay optical path formed within said splitting delay stage so as to direct toward said beam splitter said second coherent light beam after having been deflected an even number of times and having an optical path length not less than said temporal coherence length; and
    d) wherein said delay optical path returns to said first location offset from the aforesaid reference optical axis.

17. An illumination optical apparatus according to claim 16, wherein said splitting delay apparatus includes an even number of reflecting members arranged along said delay optical path, and said second coherent light beam returns to said beam splitter after being sequentially reflected by said reflecting members.

18. An illumination optical apparatus according to claim 17, wherein each of said reflecting members is a reflecting mirror arranged so that light beams incident thereon become S-polarized upon reflection therefrom.

19. An illumination optical apparatus according to claim 16, wherein said splitting delay apparatus includes a plurality of splitting delay stages from a first splitting delay stage to an nth splitting delay stage, where n is an integer greater than 1, wherein said first splitting delay stage splits said first coherent light beam incident thereon into first and second light beams having a first optical path length difference between them, said splitting delay apparatus constituted such that said nth splitting delay stage splits a light beam incident thereon by way of said (n−1)th splitting delay stage into two light beams imparted with an optical path length difference between them that is n times that of said first optical path length difference.

20. An exposure apparatus for exposing a pattern present a mask onto a substrate, comprising:
    a) an illumination optical apparatus according to claim 1;
    b) a projection objective lens adjacent said illumination optical apparatus and having an image plane and an object plane;
    c) a mask holder arranged between said illumination optical system and said projection objective lens capable of holding the mask in said object plane; and
    d) a substrate holder adjacent the projection objective lens and opposite said mask holder, capable of holding a substrate in said image plane.

21. A method of exposing a pattern present a mask onto a substrate, comprising the steps of:
    a) providing an illumination optical apparatus according to claim 1;
    b) illuminating the mask with said illumination optical apparatus
    c) projecting the pattern of the mask onto through a projection objective lens arranged adjacent mask; and
    d) exposing the pattern onto photosensitive substrate arranged adjacent said projection objective lens and opposite said mask.

22. A method of adjusting an illumination optical apparatus having a first light source that emits a ultraviolet light beam, a second light source that emits a second light beam having a wavelength different from said ultraviolet light beam, and a reflecting mirror having first and second sides, said first side arranged facing said first light source and having a first film designed to reflect said ultraviolet light beam and said second side arranged facing said second light source and having a second film designed to reflect said second light beam, the method comprising the steps of:
    a) illuminating said second side of said reflecting mirror with said second light beam;
    b) measuring light reflected from said second side; and
    c) making fine adjustments to said reflecting mirror based on measurement in said step b).

23. An illumination optical apparatus according to claim 10, wherein said plane that contains said first delay optical path extends perpendicular to said first light beam entering into said splitting member.

* * * * *